(12) United States Patent
Moran et al.

(10) Patent No.: US 10,658,558 B2
(45) Date of Patent: May 19, 2020

(54) LED PACKAGE INCLUDING CONVERTER CONFINEMENT

(71) Applicant: Lumileds LLC, San Jose, CA (US)

(72) Inventors: Brendan Moran, San Jose, CA (US); Lex Kosowsky, San Jose, CA (US)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 15/729,269

(22) Filed: Oct. 10, 2017

(65) Prior Publication Data

US 2019/0109268 A1  Apr. 11, 2019

(51) Int. Cl.
| | |
|---|---|
| *H01L 33/64* | (2010.01) |
| *H01L 33/58* | (2010.01) |
| *H01L 33/60* | (2010.01) |
| H01L 33/48 | (2010.01) |
| H01L 33/50 | (2010.01) |
| H01L 21/64 | (2006.01) |

(52) U.S. Cl.
CPC ............ *H01L 33/644* (2013.01); *H01L 33/58* (2013.01); *H01L 33/60* (2013.01); *H01L 21/64* (2013.01); *H01L 33/486* (2013.01); *H01L 33/50* (2013.01); *H01L 33/502* (2013.01); *H01L 2933/0033* (2013.01); *H01L 2933/0041* (2013.01); *H01L 2933/0058* (2013.01); *H01L 2933/0075* (2013.01); *H01L 2933/0091* (2013.01)

(58) Field of Classification Search
CPC ........ H01L 33/644; H01L 33/50; H01L 21/64
See application file for complete search history.

(56) References Cited

U.S. PATENT DOCUMENTS

| | | | |
|---|---|---|---|
| 2009/0295265 A1* | 12/2009 | Tabuchi | ................. H01L 33/56 313/112 |
| 2010/0258830 A1* | 10/2010 | Ide | .......................... H01L 33/60 257/98 |

(Continued)

FOREIGN PATENT DOCUMENTS

| | | |
|---|---|---|
| TW | 201926743 A | 7/2019 |
| WO | 2014/081042 | 5/2014 |
| WO | WO-2019074873 A1 | 4/2019 |

OTHER PUBLICATIONS

"International Application Serial No. PCT/US2018/054922, International Search Report dated Apr. 12, 2018", 3 pgs.

(Continued)

*Primary Examiner* — Thao X Le
*Assistant Examiner* — Xia L Cross
(74) *Attorney, Agent, or Firm* — Schwegman Lundberg & Woessner, P.A.

(57) ABSTRACT

A light-emitting device is disclosed, including: a substrate; a light-emitting diode (LED) formed on a first surface of the substrate, the LED being arranged to emit primary light; a fence disposed on a second surface of the substrate, the fence including a plurality of walls arranged to define a cell; a light-converting structure disposed in the cell, the light-converting structure being arranged to convert at least a portion of the primary light to secondary light having a wavelength that is different from the wavelength of the primary light; and a reflective element formed on one or more outer surfaces of the walls of the fence, such that the reflective element and the light-converting structure are disposed on opposite sides of the walls of the fence.

19 Claims, 16 Drawing Sheets

(56) References Cited

U.S. PATENT DOCUMENTS

| | | | |
|---|---|---|---|
| 2011/0309398 A1* | 12/2011 | Ito | H01L 33/505 |
| | | | 257/98 |
| 2013/0026518 A1 | 1/2013 | Suh et al. | |
| 2014/0328083 A1* | 11/2014 | Oh | H01L 33/486 |
| | | | 362/612 |
| 2015/0060915 A1* | 3/2015 | Lee | H01L 33/62 |
| | | | 257/98 |
| 2015/0204494 A1 | 7/2015 | Wada et al. | |
| 2016/0020370 A1* | 1/2016 | Cai | H01L 33/60 |
| | | | 257/88 |
| 2016/0351620 A1 | 12/2016 | Tanaka | |
| 2017/0084787 A1* | 3/2017 | Emura | H01L 33/387 |

OTHER PUBLICATIONS

"International Application Serial No. PCT/US2018/054922, Written Opinion dated Apr. 12, 2018", 6 pgs.

* cited by examiner

LED PACKAGE INCLUDING CONVERTER CONFINEMENT

FIELD OF INVENTION

The present disclosure relates to light-emitting devices in general, and more particularly, to an LED package including a converter confinement.

BACKGROUND

Light emitting diodes ("LEDs") are commonly used as light sources in various applications. The main functional part of an LED may be a semiconductor chip comprising two injecting layers of opposite conductivity types (p-type and n-type), and a light-emitting active layer for radiative recombination in which injection of carriers takes place. The semiconductor chip is usually placed in a package that provides electrical connections between the semiconductor chip and the outside world, in addition to protection against vibration and thermal damage. In addition to the semiconductor chip, the LED package may also include a light converter, a reflecting element, and various other components. These components may have differing coefficients of thermal expansion, which makes them susceptible to cracking, delamination, and various other types of mechanical damage.

Accordingly, the need exists for LED package designs that reduce the likelihood of mechanical damage when elements with different coefficients of thermal expansion are used in the same LED package.

SUMMARY

The present disclosure addresses this need. According to one aspect of the disclosure, a light-emitting device is provided, comprising: a substrate; a light-emitting diode (LED) formed on a first surface of the substrate, the LED being arranged to emit primary light; a fence disposed on a second surface of the substrate, the fence including a plurality of walls arranged to define a cell; a light-converting structure disposed in the cell, the light-converting structure being arranged to convert at least a portion of the primary light to secondary light having a wavelength that is different from the wavelength of the primary light; and a reflective element formed on one or more outer surfaces of the walls of the fence, such that the reflective element and the light-converting structure are disposed on opposite sides of the walls of the fence.

According to another aspect of the disclosure, an article of manufacture is provided, comprising: a wafer including a plurality of light-emitting diodes (LEDs) formed on a first surface of the wafer; a fence structure coupled to a second surface of the wafer opposite the first surface, the fence structure including a plurality of cells, each cell being aligned with a different one of the LEDs; and a plurality of light-converting structures, each light-converting structure being disposed in a different cell of the fence structure, such that each light-converting structure is aligned with a different one of the plurality of LEDs.

According to yet another aspect the disclosure, a method for manufacturing light-emitting devices is provided, comprising: forming a plurality of light-emitting diodes (LEDs) on a first surface of a wafer; forming a fence structure including a plurality of walls that are arranged to define a plurality of cells; coupling the fence structure to a second surface of the wafer that is opposite the first surface by aligning each one of the plurality of cells to a different one of the plurality of LEDs; applying a light-converting material on the second surface of the wafer to form a different respective light-converting structure in each of the plurality of cells; and longitudinally cutting the walls of the fence structure and portions of the wafer that are coupled to the walls of the fence structure to form a plurality of light-emitting devices, wherein each light-emitting device includes a different respective LED, a different respective cell of the fence structure, and a different respective light-converting structure that is formed in the cell.

BRIEF DESCRIPTION OF THE DRAWINGS

The drawings described below are for illustration purposes only. The drawings are not intended to limit the scope of the present disclosure. Like reference characters shown in the figures designate the same parts in the various embodiments.

DETAILED DESCRIPTION

Figure 1A:
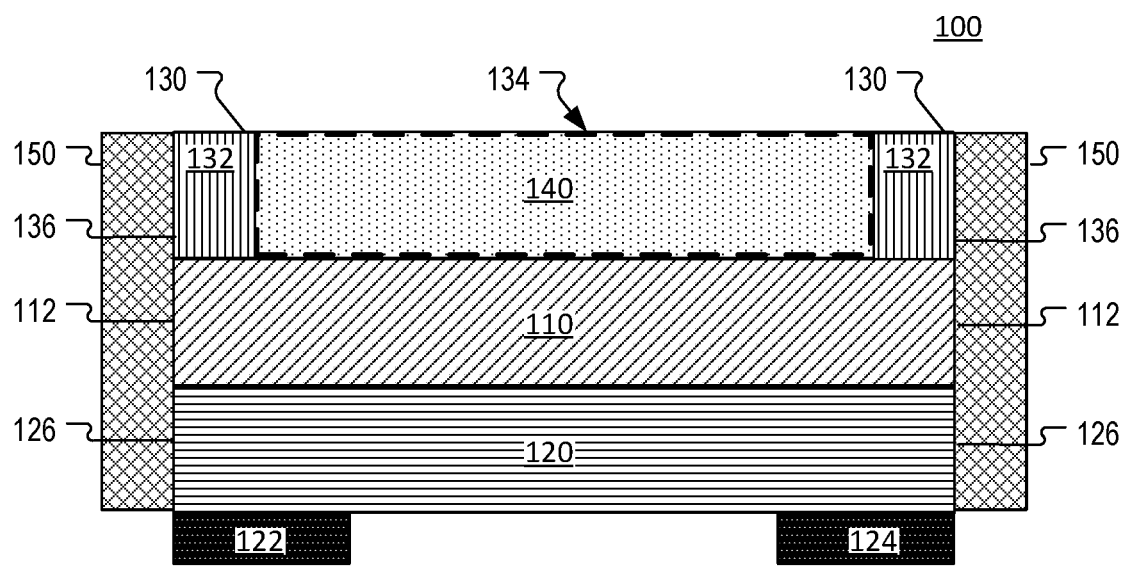
FIG. 1A is a cross-sectional side view of an example of a light emitting diode (LED) package, according to aspects of the disclosure.

Chip-scale packaged (CSP) light emitting diodes (LEDs) have been either offered for sale or commercially announced for several years, most notably from Lumileds™, Nichia™, Osram™, TSMC™, Toshiba™, Seoul Semiconductor™, among others. In most cases, however, these LEDs start as a solderable primary-light (e.g., blue light) LED that is created using wafer-scale high-throughput semiconductor fabrication techniques and packaged together with a light-converting structure and additional packaging materials to create a finished LED package. The purpose behind adding the light-converting structure is to convert the primary light (e.g., blue light) to secondary light (e.g., white light). In some instances, the added packaging and light-converting structure work to direct both the primary light and the secondary light towards the surface of the package. This creates a chip-scale packaged (CSP) light-emitting device which is desirable in space-constrained applications that require secondary optics, such as camera flash lens applications, and automotive headlight applications.

Reliable primary-light CSP LEDs can be achieved with wafer fabrication techniques that allow a transparent growth substrate (e.g., sapphire) to remain intact and become the essential support structure (or volume bulk) of the device. However, the transparent nature of the growth substrate may lead to the somewhat unintentional creation of a 'volume emitter'—which emits the generated primary light (e.g., blue light) in 5 directions (4 sides, 1 top). Accordingly, placing a reflective element such as a thin film metal or thin film distributed Bragg reflector (DBR) on the sidewalls of the substrate after die fabrication can work to prevent the creation of a volume emitter.

If a light-converting structure is placed on top of a primary-light (e.g., blue) LED, another volume emitter is again created as light-converting structures by definition scatter light. To prevent the light-converting structure from acting as a volume emitter, a reflective element (e.g., a reflective film) may be formed on the sides of the light-converting structure. However, doing so may reduce the reliability and/or luminous output of a given LED package when the light-converting structure and the reflective element have different coefficients of thermal expansion (CTEs).

More specifically, typical light-converting structures may include inorganic phosphor particles suspended in an inorganic matrix, and they may have mechanical properties that are dominated by their matrix materials, most commonly silicone. The coefficient of thermal expansion of a typical light-converting structure may be in the order of 200 ppm, whereas thin film reflective elements may have a much lower CTE. For instance, silver (Ag) may have CTE of 20 ppm and a TiO2/AlO2 stack may have a CTE of 7-9 ppm. Accordingly, placing such light-converting structures in intimate contact with typical reflective elements (to produce a confined light source) may result in the reflective elements cracking and flaking off during typical assembly and operational temperature cycles.

One solution to this problem is to provide light-emitting devices with a fence that is arranged to surround the light-converting structures in those devices and provide a physical barrier between the light-converting structures and reflective elements formed on the exterior of the fence. In this regard, according to aspects of the disclosure, a light-emitting device is disclosed that includes a light emitting diode arranged to emit primary light, a light-converting structure, and a fence surrounding the light-converting structure. The fence may be a structure formed of a rigid material that is arranged to separate the light-converting structure from a reflective element (e.g., a reflective side coating) that is formed on the outer surfaces of the fence. The reflective element may have a different coefficient of thermal expansion (CTE) from the light-converting structure. However, because the fence is formed of a rigid material, the fence can withstand the forces resulting from an uneven thermal expansion of the light-converting structure and the reflective element, thereby preventing cracking and delamination of the reflective element which might occur if the reflective element were in direct contact with the light-converting structure.

According to aspects of the disclosure, a method for manufacturing light-emitting devices is provided, comprising: forming a plurality of light-emitting diodes (LEDs) on a first surface of a wafer; forming a fence structure including a plurality of walls that are arranged to define a plurality of cells; coupling the fence structure to a second surface of the wafer that is opposite the first surface by aligning each one of the plurality of cells to a different one of the plurality of LEDs; applying a light-converting material on the second surface of the wafer to form a different respective light-converting structure in each of the plurality of cells; and longitudinally cutting the walls of the fence structure and portions of the wafer that are coupled to the walls of the fence structure to form a plurality of light-emitting devices.

One feature of the method for manufacturing light-emitting devices is the addition to the wafer fabrication process of a fence structure that is formed of glass or another material. The fence structure can be chemically or mechanically bonded to the surface of the wafer, and may later be diced or otherwise singulated concurrently with the wafer when the wafer undergoes such a process. Thus, the method for manufacturing light-emitting devices produces chip-scale packaged (CSP) devices whose light generation and source quality/confinement are achieved primarily at the wafer level, thus minimizing any additional process steps following the fabrication of primary-light LEDs.

Examples of different light-emitting devices will be described more fully hereinafter with reference to the accompanying drawings. These examples are not mutually exclusive, and features found in one example can be combined with features found in one or more other examples to achieve additional implementations. Accordingly, it will be understood that the examples shown in the accompanying drawings are provided for illustrative purposes only, and they are not intended to limit the disclosure in any way. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. It will be understood that these terms are intended to encompass different orientations of the element in addition to any orientation depicted in the figures.

Relative terms such as "below" or "above" or "upper" or "lower" or "horizontal" or "vertical" may be used herein to describe a relationship of one element, layer or region to another element, layer or region as illustrated in the figures. It will be understood that these terms are intended to encompass different orientations of the device in addition to the orientation depicted in the figures.

Figure 1B:
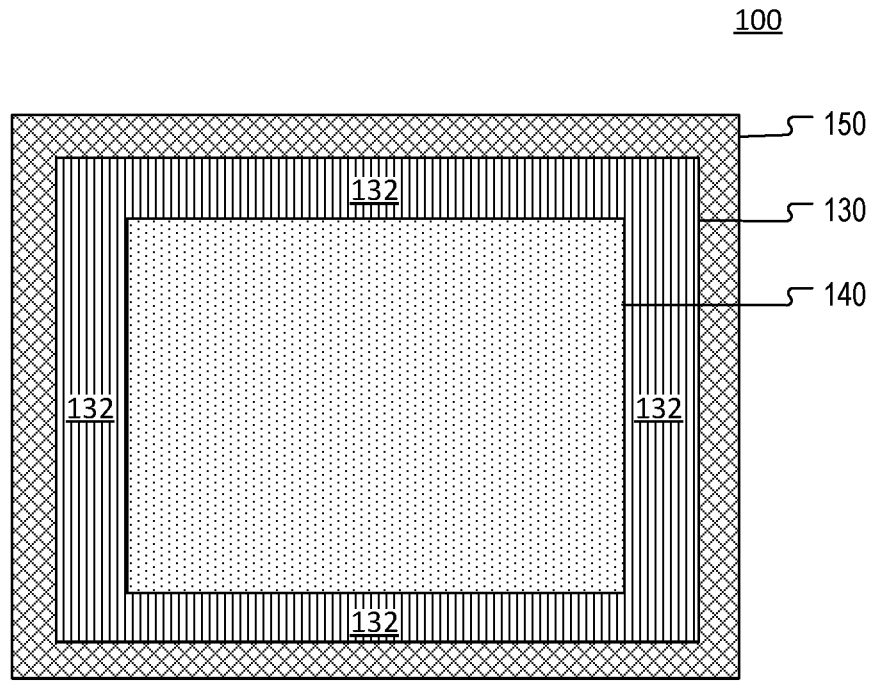
FIG. 1B is top-down view of an example the LED package of FIG. 1, according to aspects of the disclosure.

FIG. 1A is a cross-sectional side view of an example of a light-emitting device 100 and FIG. 1B is a top-down view of the light-emitting device 100, according to aspects of the disclosure. The light-emitting device 100 includes a substrate 110 having a first surface and a second surface. Formed on the first surface is a light-emitting diode (LED) 120 having contacts 122 and 124. Formed on the second surface is a fence 130 including a plurality of walls 132 that are arranged to define a cell 134 (denoted by the dashed rectangle). Disposed inside the cell 134 is a light-converting structure 140 arranged to convert primary light emitted from the LED 120 to secondary light having a wavelength that is different from the wavelength of the primary light. A reflective element 150 is disposed on the outer surfaces 136 of the fence 130, the edges 126 of the LED 120, and the edges 112 of the substrate 110.

The substrate 110 may include a sapphire substrate in the present example. However, alternative implementations are possible in which the substrate 110 includes a GaAs substrate, a Si substrate, and/or any other suitable type of substrate.

The LED 120 may include any suitable light-emitting semiconductor structure. In some implementations, the LED 120 may include a p-type layer, an n-type layer, and an active layer that are grown epitaxially on the substrate 110 using well-known deposition techniques. The active layer may be disposed between the n-type layer and the p-type layer and may emit light when forward bias is applied to the LED 120 via the contacts 122 and 124. The LED 120 may be formed using various materials, such as indium gallium nitride (InGaN) materials, aluminum gallium indium phosphide (AlGaInP) materials, aluminum gallium arsenide (AlGaAs) materials, or gallium phosphide (GaP) materials, for example.

The fence 130 may be disposed between the light-converting structure 140 and the reflective element 150. The fence 130 may confine the light-converting structure 140 and act as a physical barrier between the light-converting structure 140 and the reflective element 150. In this regard, the fence 130 may separate the light-converting structure 140 from the reflective element 150 and compensate for any mismatch between their respective coefficients of thermal expansion (CTE). More particularly, when the light-converting structure 140 has a CTE that is many times higher than the CTE of the reflective element 150 (e.g., 5 times higher, 10 times higher, 15 times higher, etc.), the fence 130 may prevent any cracking and delamination of the reflective element 150 that might otherwise occur if the reflective element 150 were to be formed directly on the light-converting structure 140.

The fence 130, in the present example, may be formed of glass and it may have a height in the order of 100-120 um. However, the present disclosure is not limited to any specific dimensions or material for the fence 130. Alternative implementations are possible in which the fence 130 is formed of any other suitable type of material and has any suitable height and/or other dimensions. For example, in some implementations, the fence 130 may be formed of aluminum, anodized aluminum, silicon and on and/or any other suitable type of metal. Additionally or alternatively, in some implementations, the fence 130 may be formed of a semiconductor material, such as silicon. In some implementations, the fence 130 may be formed of a metal that is covered with a dielectric coating. Additionally or alternatively, in some implementations, the fence 130 may be formed of a semiconductor material, such as silicon, that is covered with a dielectric coating. Additionally or alternatively, in some implementations, the fence may be formed of a ceramic material, such as Aluminum Oxide, Aluminum Nitride, Boron Nitride. Additionally or alternatively, in some implementations, the fence 130 may be formed of a material having sufficient rigidity to withstand the forces generated as a result of the light-converting structure 140 expanding due to an increase in temperature of the light-emitting device 100 without changing its shape. Additionally or alternatively, the fence 130 may be formed of any metallic material, ceramic material, and/or any other suitable type of material. Additionally or alternatively, in some implementations, the fence 130 may be formed of high-temperature stable polymers, such as LCP, or Polyimide (when coated with a reflective material).

The light-converting structure 140 may be formed of any suitable type of material. For example, the light-converting structure 140 may be formed of a light-converting material suspended in a matrix material. In some implementations, the light-converting material may include any suitable type of phosphor, such as a yellow phosphor, a red phosphor, a blue phosphor, etc. The matrix material may include a silicon binder, glass, and/or any other suitable type of material. Additionally or alternatively, in some implementations, the light-converting structure 140 may be formed of a light-converting material that is sintered, rather than being suspended in a matrix material.

The reflective element 150 may include a reflective film formed by coating the sides of the light-emitting device 100 with one or more materials. In some implementations, the reflective element 150 may be formed by coating the sides of the LED package with silver or another metal, such as aluminum. Additionally or alternatively, the reflective element 150 may be formed by coating the sides of the light-emitting device 100 with one or more dielectric materials, such as $SiO_2$, $TiO_2$, or $Si_3N_4$, $AlO_2$. Additionally or alternatively, the reflective element 150 may be a distributed Bragg reflector (DBR) including an alternating stack of materials having different refractive indexes (e.g., a $SiO_2$/$TiO_2$ stack).

FIG. 2 is a flowchart of an example of a process 200 for manufacturing a light-emitting device, according to aspects of the disclosure.

Figure 3A:
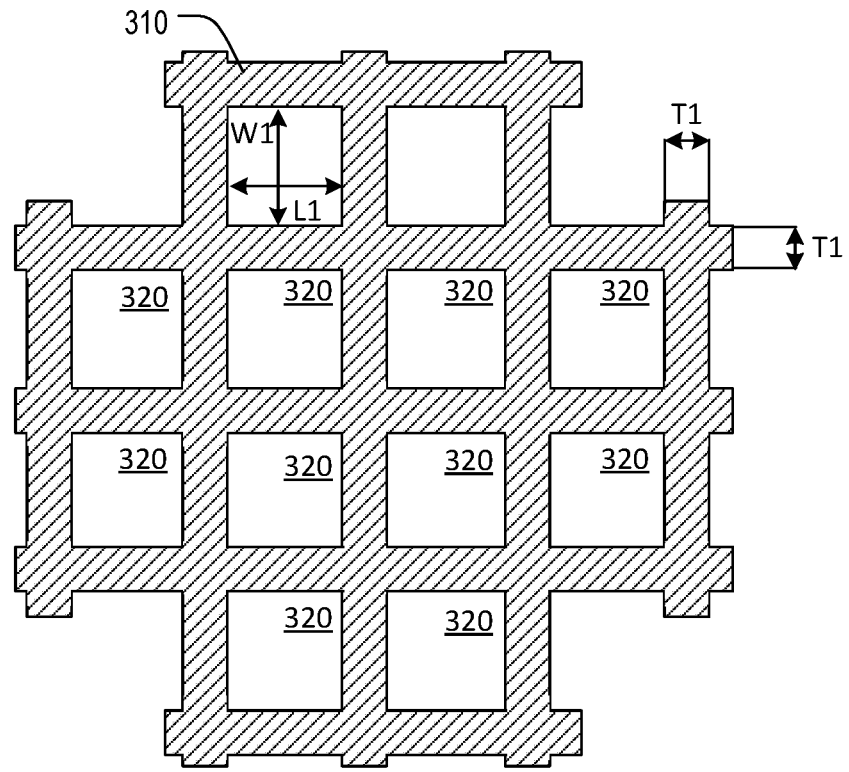
FIG. 3A is a top-down view of an example of a fence structure that is formed during a first stage of the process of FIGS. 2A-B, according to aspects of the disclosure.
Figure 3B:
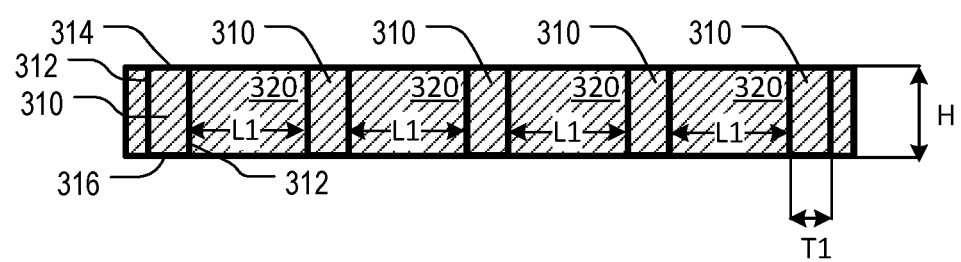
FIG. 3B is a side-view of the fence structure of FIG. 3A, according to aspects of the disclosure.

At step 205, a fence structure 300 is formed. As illustrated in FIGS. 3A-B, the fence structure 300 may include a plurality of walls 310 that are arranged to form cells 320. In some implementations, the height H of any of the walls 310 may be in the range of 100-120 um. Additionally or alternatively, in some implementations, the thickness T1 of any of the walls 310 may be in the range of 3-30 microns, and it may be dependent on the mechanical robustness of the material used to form the fence structure 300.

In some implementations, the fence structure 300 may be formed of photoimegable glass, such as the Foturon™ glass manufactured by Schott Glass™. The fence structure 300 may be formed by etching the cells 320 into a glass sheet, using any suitable etching technique, such as photo patterning or wet etching, for example. Additionally or alternatively, in some implementations, the fence structure 300 may be formed of a metal, such as aluminum, anodized aluminum, and/or another suitable metal. Additionally or alternatively, in some implementations, the fence structure 300 may be formed of a semiconductor material, such as silicon. Additionally or alternatively, in some implementations, the fence structure 300 may be formed of quartz, machinable ceramic, moldable ceramic, and/or photoimegeable ceramic. Additionally or alternatively, in some implementations, the fence structure 300 may be made of a material capable of forming smooth surfaces when it is cut or etched. In this regard, the present disclosure is not limited to any particular material and/or process for manufacturing the fence structure 300. Although in the present example the fence structure 300 is a grid including a plurality of rectangular cells, alternative implementations are possible in which the fence structure 300 may include any suitable shape of cells, such as round cells, octagonal cells, hexagonal cells, etc.

Figure 4A:
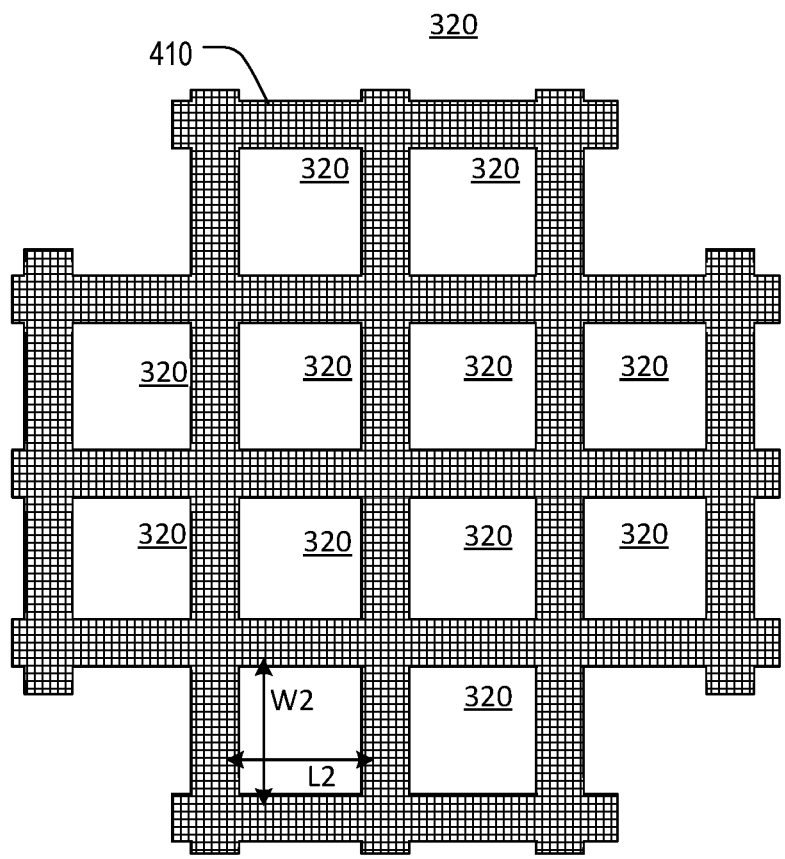
FIG. 4A is a top-down view of the fence structure of FIG. 3A during a second stage of the process of FIGS. 2A-B, according to aspects of the disclosure.
Figure 4B:
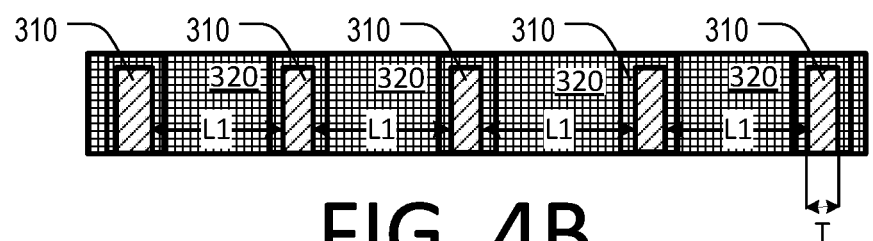
FIG. 4B is a cross-sectional side view of the fence structure of FIG. 4A during the second stage of the process of FIGS. 2A-B, according to aspects of the disclosure.

At step 210, a reflective element 410 is formed on the fence structure 300. As illustrated in FIGS. 4A-B, the reflective element 410 may be a reflective film that is formed by coating the walls 310 of the fence structure 300 with one or more dielectric and/or conductive materials, such as $SiO_2$, $TiO_2$, $Si_3N_4$, Ag, or Al. Additionally or alternatively, in some implementations, the reflective element 410 may be a distributed Bragg reflector (DBR) including an alternating stack of materials having differing refractive indices. For instance, in one implementation, the reflective element 410 may include an alternating stack of $SiO_2$ and $TiO_2$ layers. In the present example, the side surfaces 312 and the top surface 314 are covered by the reflective element 410. The reflective element 410 may be formed using atomic layer deposition (ALD), chemical vapor deposition (CVD), and/or any other suitable deposition technique. Although in the present example of the bottom surfaces 316 of the walls 310 are not covered by the reflective element 410, alternative implementations are possible in which the bottom surfaces 316 are also covered.

Figure 5A:
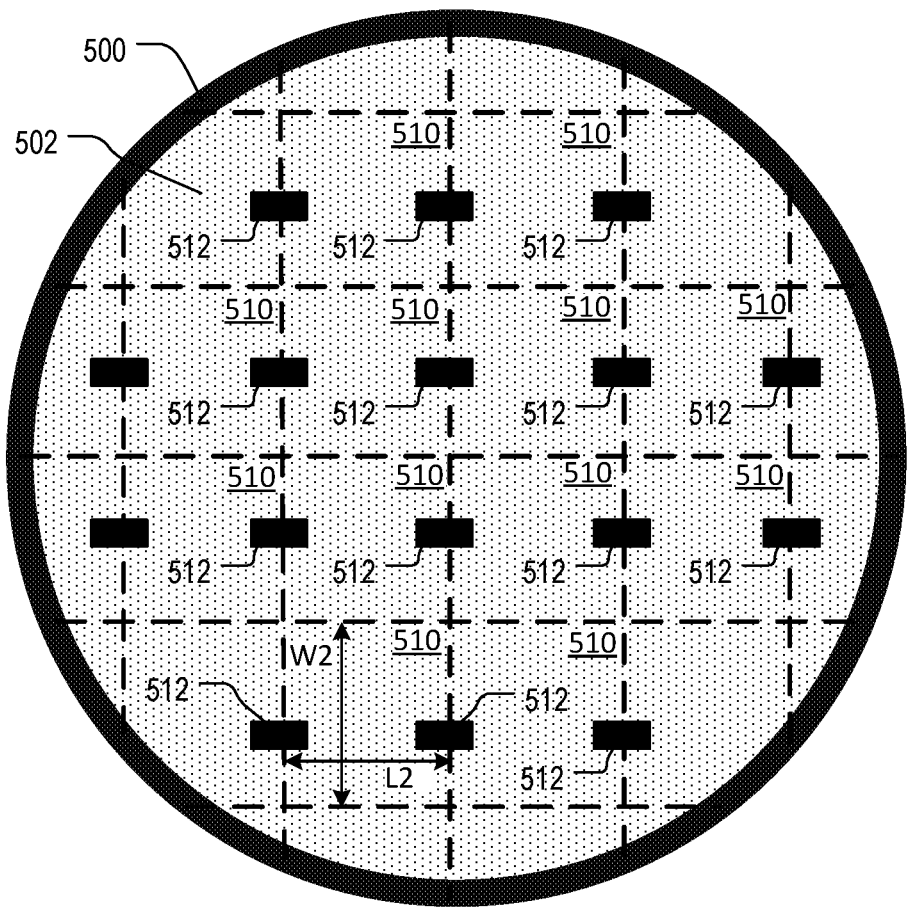
FIG. 5A is a top-down view of a wafer containing a plurality of LEDs formed during a third stage of the process of FIGS. 2A-B, according to aspects of the disclosure.
Figure 5B:
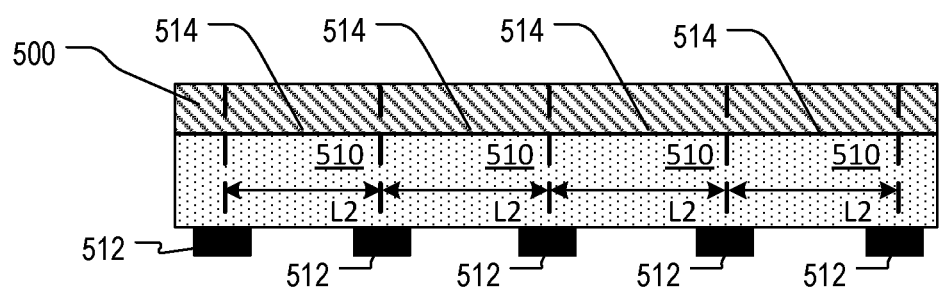
FIG. 5B is a cross-sectional side view of the wafer of FIG. 5A during the third stage of the process of FIGS. 2A-B, according to aspects of the disclosure.

At step 215, a plurality of light emitting diodes (LEDs) 510 is formed on a first surface 502 of a wafer 500 (FIGS. 5A-B). Each LED 510 may include any suitable type of light-emitting semiconductor device. For example, each LED 510 may include at least a p-type layer, an n-type layer, and an active layer that are grown on the wafer 500 using well-known deposition techniques. Although the LEDs 510 are integral with one another, alternative implementations are possible in which the LEDs 510 are separate. The LEDs 510 may be formed using various materials, such as indium gallium nitride (InGaN) materials, aluminum gallium indium phosphide (AlGaInP) materials, aluminum gallium arsenide (AlGaAs) materials, or gallium phosphide (GaP) materials, for example.

Each LED 510 may have a width W2 that is larger than the width W1 of the cells 320. Additionally or alternatively, each LED 510 may have a length L2 that is larger than the length L1 of the cells 320. Additionally or alternatively, each LED 510 may have a top surface 514 that is larger than the area of the cells 320. In this regard, when the fence structure 300 is mounted on the wafer 500, each cell 320 may be placed above the top surface 514 of a respective LED 510 without extending outside of that top surface.

Figure 6A:
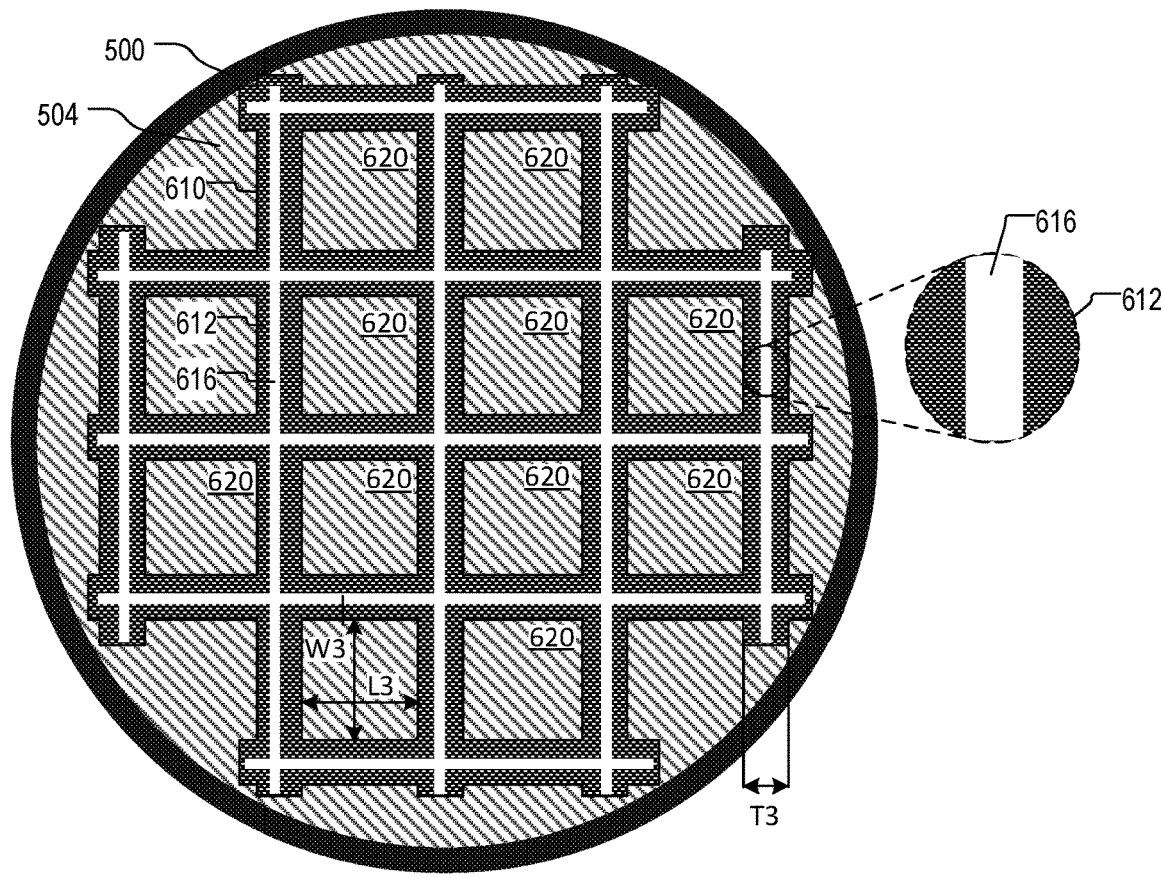
FIG. 6A is a top-down view of the wafer of FIG. 5A during a fourth stage of the process of FIGS. 2A-B, according to aspects of the disclosure.
Figure 6B:
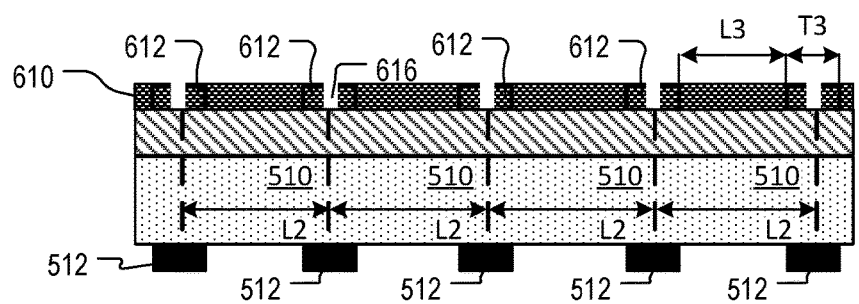
FIG. 6B is a cross-sectional side view of the wafer of FIG. 5A during the fourth stage of the process of FIGS. 2A-B, according to aspects of the disclosure.

At step 220, a reflective pattern 610 is formed on a second surface 504 of the wafer 500. As illustrated in FIGS. 6A-B, the reflective pattern 610 may include a plurality of reflective lines 612 arranged to form cells 620. Any of the reflective lines 612 may be formed of one or more conductive and/or dielectric materials, such as $SiO_2$, $TiO_2$, $Si_3N_4$, Ag, or Al. Additionally or alternatively, in some implementations, any reflective line 612 may include a distributed Bragg reflector (DBR) comprising an alternating stack of materials having differing refractive indices. For example, any of the reflective lines 612 may include an alternating stack of $SiO_2$ and $TiO_2$ layers.

In some implementations, the reflective pattern 610 may match the footprint of the fence structure 300. The footprint of the fence structure 300 may have the same or similar profile as the top surface of the fence structure 300, which is shown in FIG. 3A. When the fence structure 300 is placed over the reflective pattern 610 (see step 230 below), each of the reflective lines 612 may become situated under a different wall 310 of the fence structure 300, thereby preventing light from travelling through the bottom surfaces 316 of the walls of the fence structure.

In some implementations, one or more of the reflective lines 612 may include a respective light-transmissive portion 616 that extends along the lines' respective lengths. The light transmissive portion 616 in each line may be sandwiched between two reflective portions of the line, as shown. The light-transmissive portion 616 may be provided to allow laser light to travel through the reflective pattern 610. As is further discussed below, the laser light may be used to cut the wafer and/or the fence structure 300. Additionally or alternatively, in some implementations, the reflective lines 612 may be solid (thus lacking a light-transmissive portion).

In some implementations, each of the cells 620 may have a width W3 that is substantially the same as the width W1 of the cells 320. Additionally or alternatively, each of the cells 620 may have a length L3 that is substantially the same the length L1 of the cells 320. Additionally or alternatively, each of the lines 612 may have a thickness T3 that is substantially the same to the thickness T1 of the walls 310 of the fence structure 300.

Although in the present example the reflective pattern 610 has dimensions that are substantially the same to the dimensions of the fence grid, alternative implementations are possible in which one or more of the dimensions of the pattern 610 (e.g., cell width, cell length, line thickness, etc.) are different from those of the fence structure 300. For example, in some implementations, the thickness T3 of the lines 712 may be lower (or greater) than that the thickness T1 of the walls 310 of the fence structure 300. As another example, the width W3 of the cells 620 may be lower (or greater) than the width W1 of the cells 320. As yet another example, the length L3 of the cells 620 may be lower (or greater) than the length L1 of the cells 320.

In some implementations, the reflective pattern 610 may only partially match the footprint of the fence structure 300. In such instances, one or more of the reflective lines 612 may be only partially situated underneath the walls 310 of the fence structure 300 when the fence structure 300 is placed on the wafer 500 (see step 230 below). Additionally or alternatively, in such instances, one or more of the reflective lines 612 may not overlap at all with the walls 310. Stated succinctly, in some implementations, at least one of the lines 612 may be only partially coincident with a given wall 310 (or not coincident with any of the walls 310) when the fence structure 300 is mounted on the wafer 500.

Figure 7A:
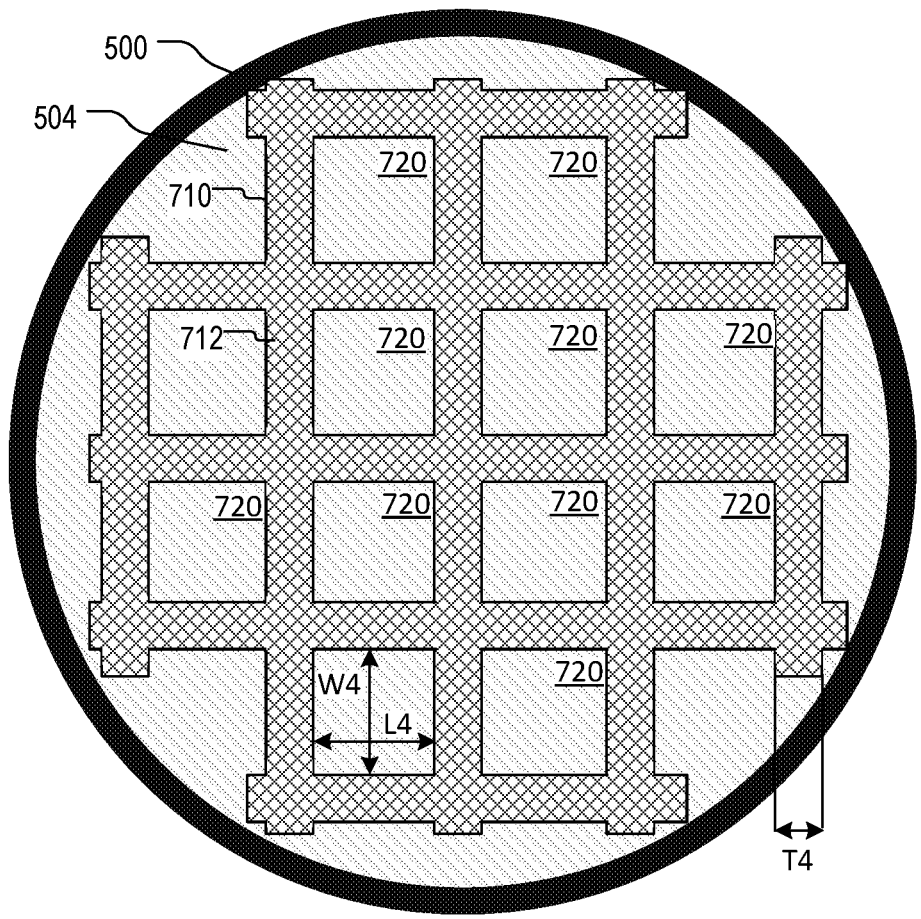
FIG. 7A is a top-down view of the wafer of FIG. 5A during a fifth stage of the process of FIGS. 2A-B, according to aspects of the disclosure.
Figure 7B:
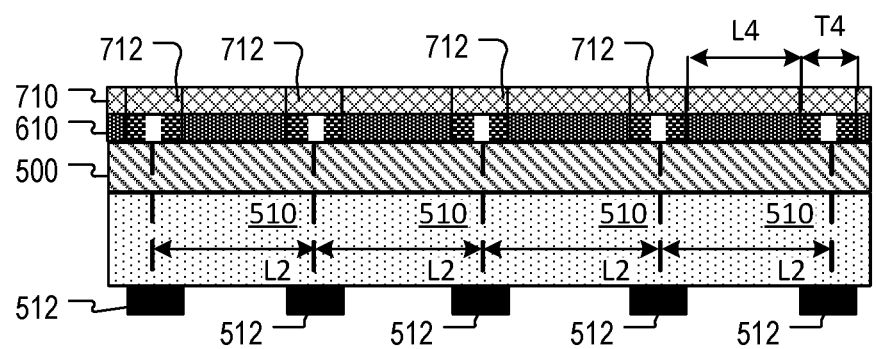
FIG. 7B is a cross-sectional side view of the wafer of FIG. 5A during the fifth stage of the process of FIGS. 2A-B, according to aspects of the disclosure.

At step 225, a bonding pattern 710 is formed over the reflective pattern 610. As illustrated in FIGS. 7A-B, the bonding pattern 710 may include a plurality of lines 712 arranged to form cells 720. Any of the lines 712 may be formed of a material capable of facilitating the bonding between the fence structure 300 and the wafer 500. For example, in some implementations, one or more of the lines 712 may be formed of Silicone, SiO2, Al$_2$O$_3$, and/or any other suitable material. In some implementations, the bonding pattern 710 may match the footprint of the fence structure. The footprint of the fence structure 300 may have the same or similar profile as the top surface of the fence structure 300, which is shown in FIG. 3A. When the fence structure 300 is placed over the bonding pattern 710, each of the lines 712 may become (completely or partially) situated under a different wall 310 of the fence structure 300, thereby facilitating the bonding of that wall to the surface 504 of the wafer 500 (see step 230 below).

In some implementations, each of the cells 720 may have a width W4 that is substantially the same as the width W1 of the cells 320. Additionally or alternatively, each of the cells 720 may have a length L4 that is substantially the same as the length L1 of the cells 320. Additionally or alternatively, each of the lines 512 may have a thickness T4 that is substantially the same to the thickness T1 of the walls 310 of the fence structure 300.

Although in the present example the first pattern 710 has dimensions that are substantially the same as those of the fence structure 300, alternative implementations are possible in which one or more dimensions of the bonding pattern 710 (e.g., cell width, cell length, line thickness, etc.) are different from those of the fence structure 300. For example, in some implementations, the thickness T4 of the lines 712 may be lower (or greater) than that the thickness T1 of the walls 310 of the fence structure 300. As another example, the width W4 of the cells 720 may be lower (or greater) than the width W1 of the cells 320. As yet another example, the length L4 of the cells 720 may be lower (or greater) than the length L1 of the cells 320.

In some implementations, the bonding pattern 710 may only partially match the footprint of the fence structure 300. In such instances, one or more of the lines 712 may be only partially situated underneath the walls 310 of the fence structure 300 when the fence structure 300 is placed on the wafer 500 (see step 230 below). Additionally or alternatively, in such instances, one or more of the lines 712 may not overlap at all with the walls 310. Stated succinctly, in some implementations, at least one of the lines 712 may be only partially coincident with a given wall 310 (or not coincident with any of the walls 310) when the fence structure 300 is mounted on the wafer 500.

Figure 8A:
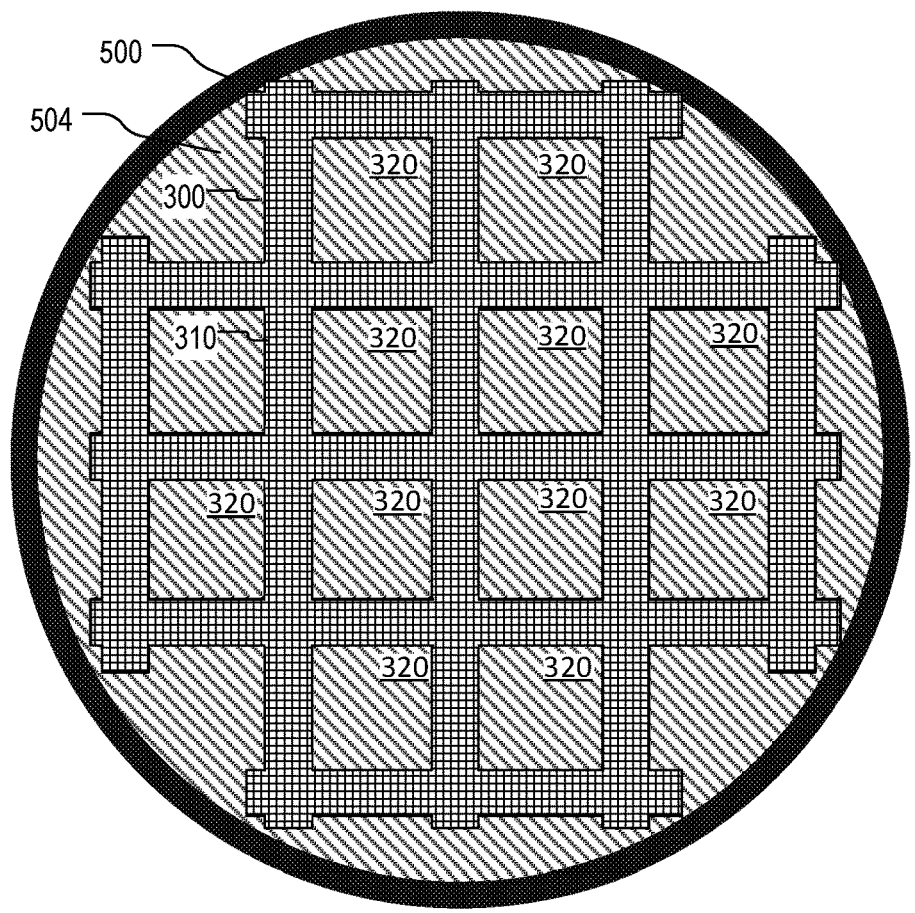
FIG. 8A is a top-down view of the wafer of FIG. 5A during a sixth stage of the process of FIGS. 2A-B, according to aspects of the disclosure.
Figure 8B:
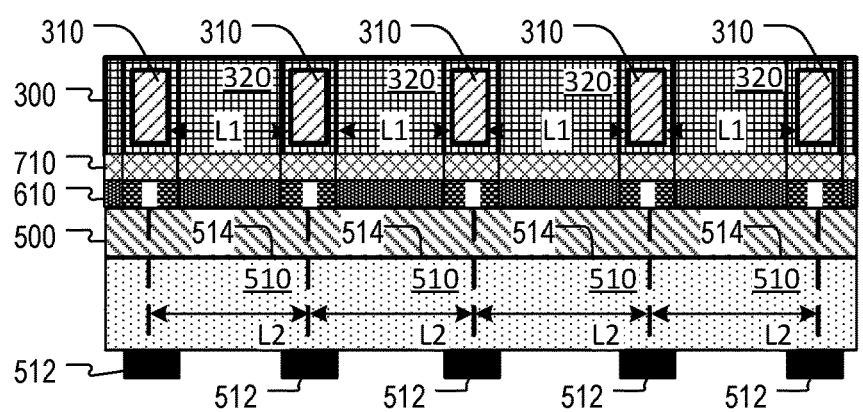
FIG. 8B is a cross-sectional side view of the wafer of FIG. 5A during the sixth stage of the process of FIGS. 2A-B, according to aspects of the disclosure.

At step 230, the fence structure 300 is mounted on the surface 504 of the wafer 500. As illustrated in FIGS. 8A-B, the fence structure 300 may be placed onto the bonding pattern 710, such that each of the walls 310 is aligned with a different one of the lines 712. As a result, each of the lines 712 of the bonding pattern 710 may remain under a different wall 310 of the fence structure 300. Furthermore, each of the lines 712 may extend along the length of the wall 310 it is situated under. Similarly, each of the reflective lines 612 of the reflective pattern 610 may remain under a different wall 310 of the fence structure 300, as well. Furthermore, just like the lines 712, each of the reflective lines 612 of the reflective pattern 610 may also extend along the length of the wall 310 it is situated under.

The fence structure 300 may be bonded to the surface 504 of the wafer 500 using any suitable type of bonding process, such as thermionic bonding, ultrasonic bonding, and/or any traditional wafer bonding technique. In some implementations, each of the cells 320 may become aligned with a different one of the LEDs 510, when the fence structure 300 is mounted on the surface 504 of the wafer 500. As a result, each of the cells 320 may completely overlap with the top surface 514 of a different LED 510, as shown. In some implementations, the alignment between the cells 320 and the LEDs 510 may be achieved by using a wafer liner when mounting the fence structure 300 on the surface 504 of the wafer 500. For example, a wafer bond liner manufactured by EVG™ of Florian am Inn, Austria may be used.

Figure 9A:
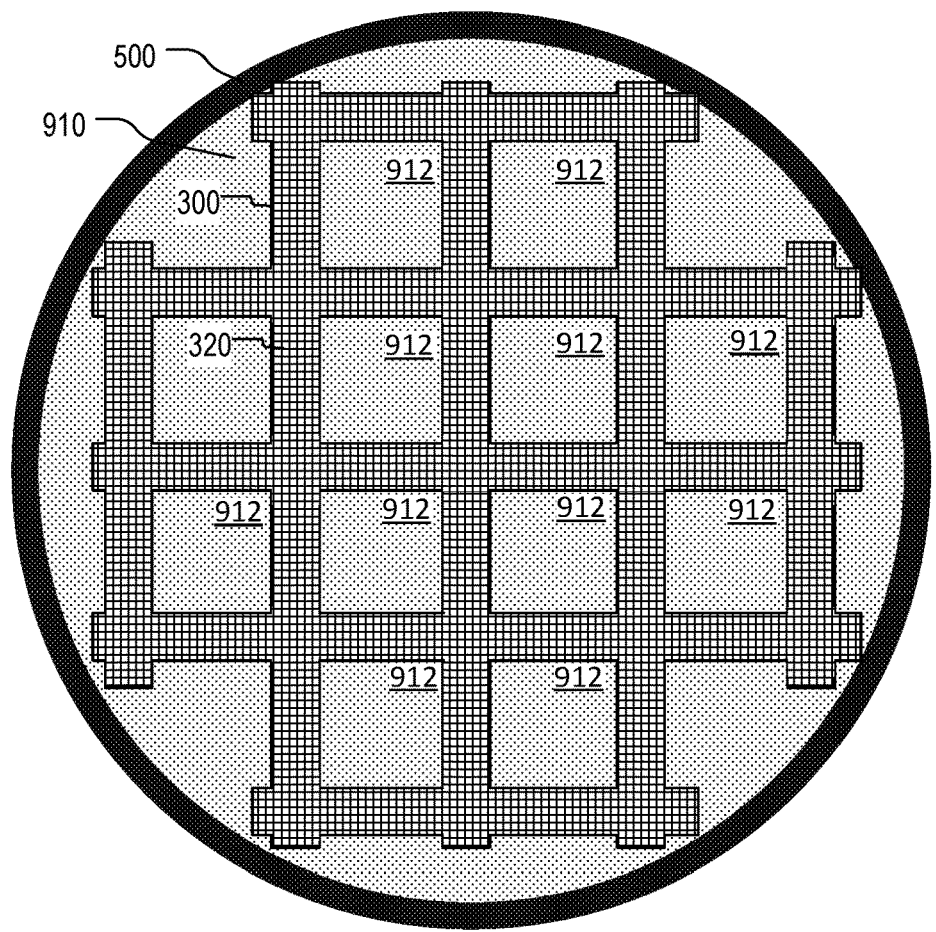
FIG. 9A is a top-down view of the wafer of FIG. 5A during a seventh stage of the process of FIGS. 2A-B, according to aspects of the disclosure.
Figure 9B:
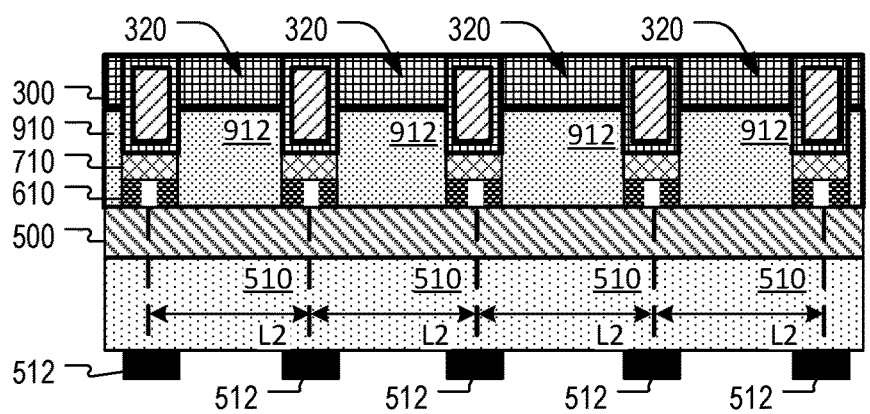
FIG. 9B is a cross-sectional side view of the wafer of FIG. 5A during the seventh stage of the process of FIGS. 2A-B, according to aspects of the disclosure.

At step 235, a layer of light-converting material 910 is deposited on the surface 504 of the wafer 500 to form a different light-converting structure 912 in each of the cells 320 of the fence structure 300. As illustrated in FIGS. 9A-B, each of the cells 320 may be filled only partially with the light-converting material 910. However, alternative implementations are possible in which each of the cells 320 is filled completely with the light-converting material 910.

In some implementations, the light-converting material 910 may include a phosphor suspended in a matrix material. The phosphor may include a yellow phosphor, a red phosphor, a blue phosphor, etc. The matrix material may include a silicon binder, glass, and/or any other suitable type of material. Additionally or alternatively, in some implementations, each light-converting structure 912 may be formed of a light-converting material that is sintered, rather than being suspended in a matrix material.

Figure 10A:
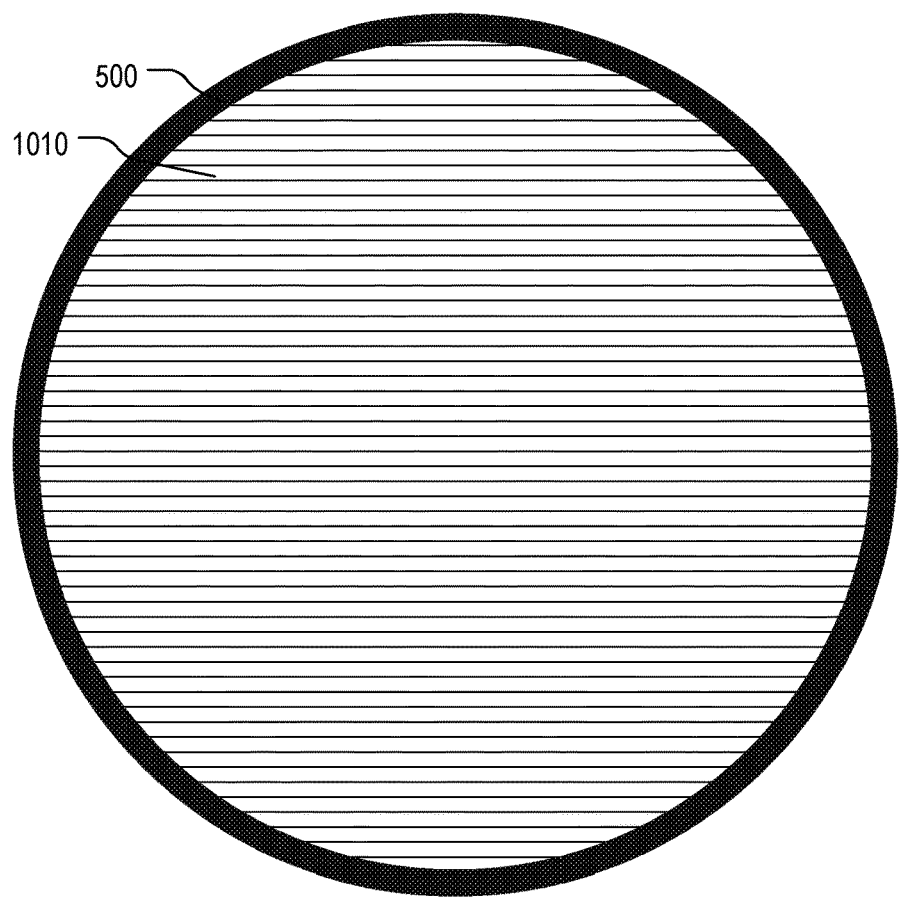
FIG. 10A is a top-down view of the wafer of FIG. 5A during an eight stage of the process of FIGS. 2A-B, according to aspects of the disclosure.
Figure 10B:
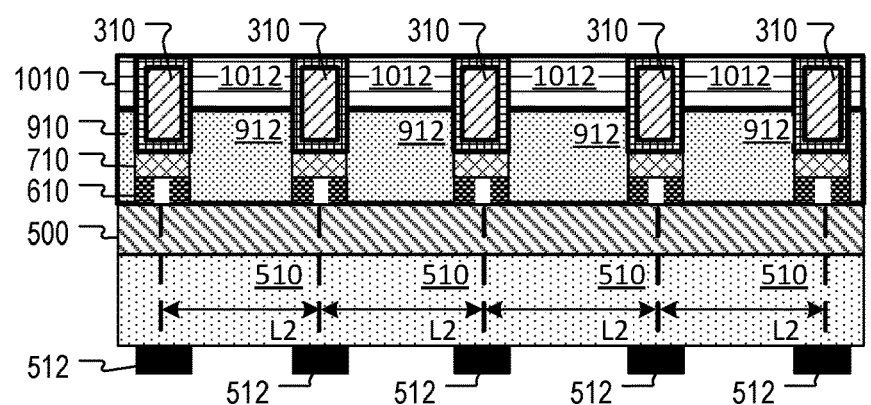
FIG. 10B is a cross-sectional side view of the wafer of FIG. 5A during the eight stage of the process of FIGS. 2A-B, according to aspects of the disclosure.

At step 240, a layer of light-diffusing material 1010 is deposited over the layer of light-converting material 910 to form a plurality of light-diffusing structures 1012. The light-diffusing material may include $TiO_2$, and/or any other suitable type of material. As illustrated in FIGS. 10A-B, each light diffusing structure may be situated in a different cell 320 of the fence structure 300. Although in the present example the light-diffusing material 1010 completely fills the remaining space in the cells 320, while also overflowing the fence structure 300, alternative implementations are possible in which the remaining space in each of the cells 320 is filled only partially with the light diffusing materials. In such instances, room may be left in each of the cells 320 for applying another layer of material. This material can be used to further condition or filter secondary light that is emitted from the light-converting structures 912 to achieve a desired luminous output.

Figure 11A:
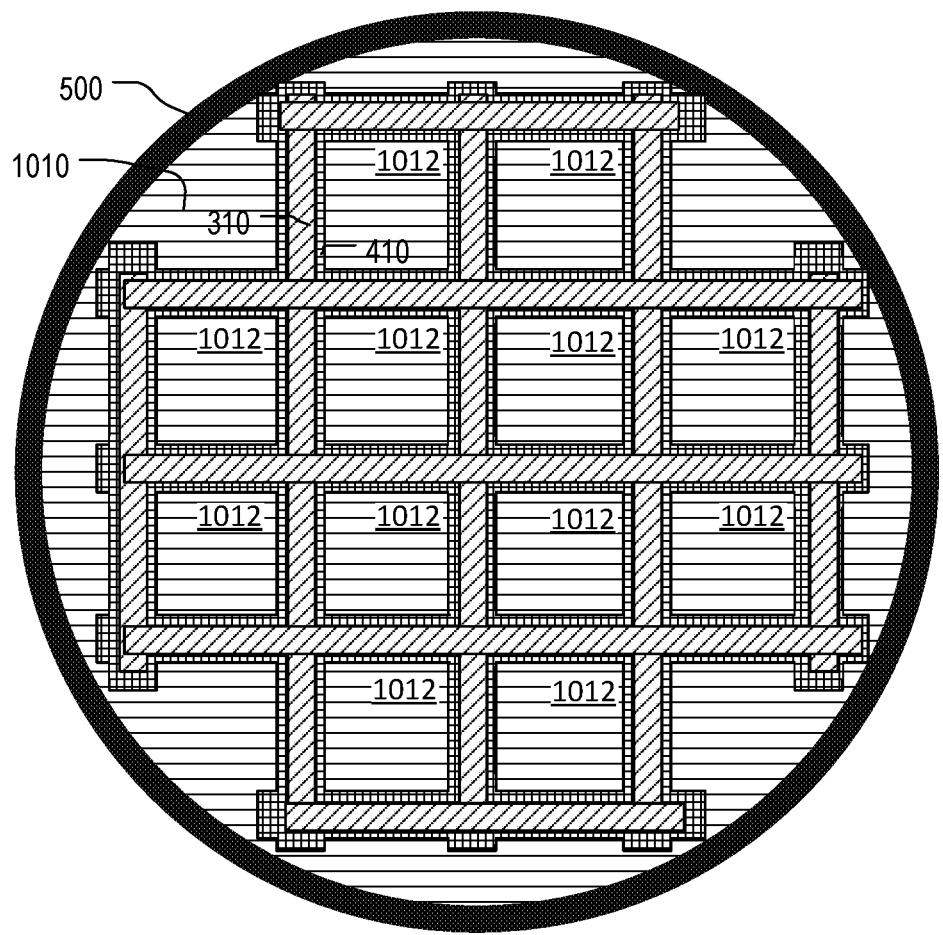
FIG. 11A is a top-down view of the wafer of FIG. 5A during a ninth stage of the process of FIGS. 2A-B, according to aspects of the disclosure.
Figure 11B:
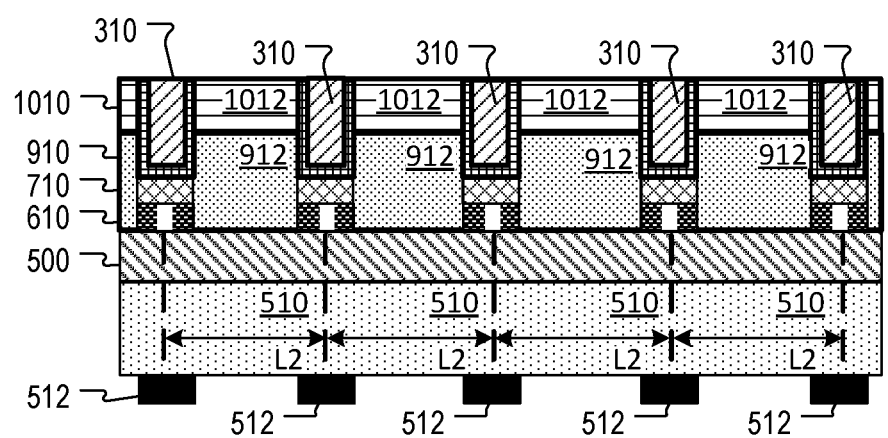
FIG. 11B is a cross-sectional side view of the wafer of FIG. 5A during the ninth stage of the process of FIGS. 2A-B, according to aspects of the disclosure.

At step 245, the top portion of the light-diffusing material 1010 is removed to achieve a desirable thickness of the light-diffusing structures 1012. In some implementations, together with removing the top portion of the layer of light-diffusing material 1010, the top portion of the reflective element 410 and/or the top portion of the walls 310 of the fence structure 300 may also be removed, as shown in FIGS. 11A-B. The top portion of the light-diffusing material 1010 may be removed using any suitable technique, such as back grinding, fly cutting, polishing or abrasion blasting.

Figure 12A:
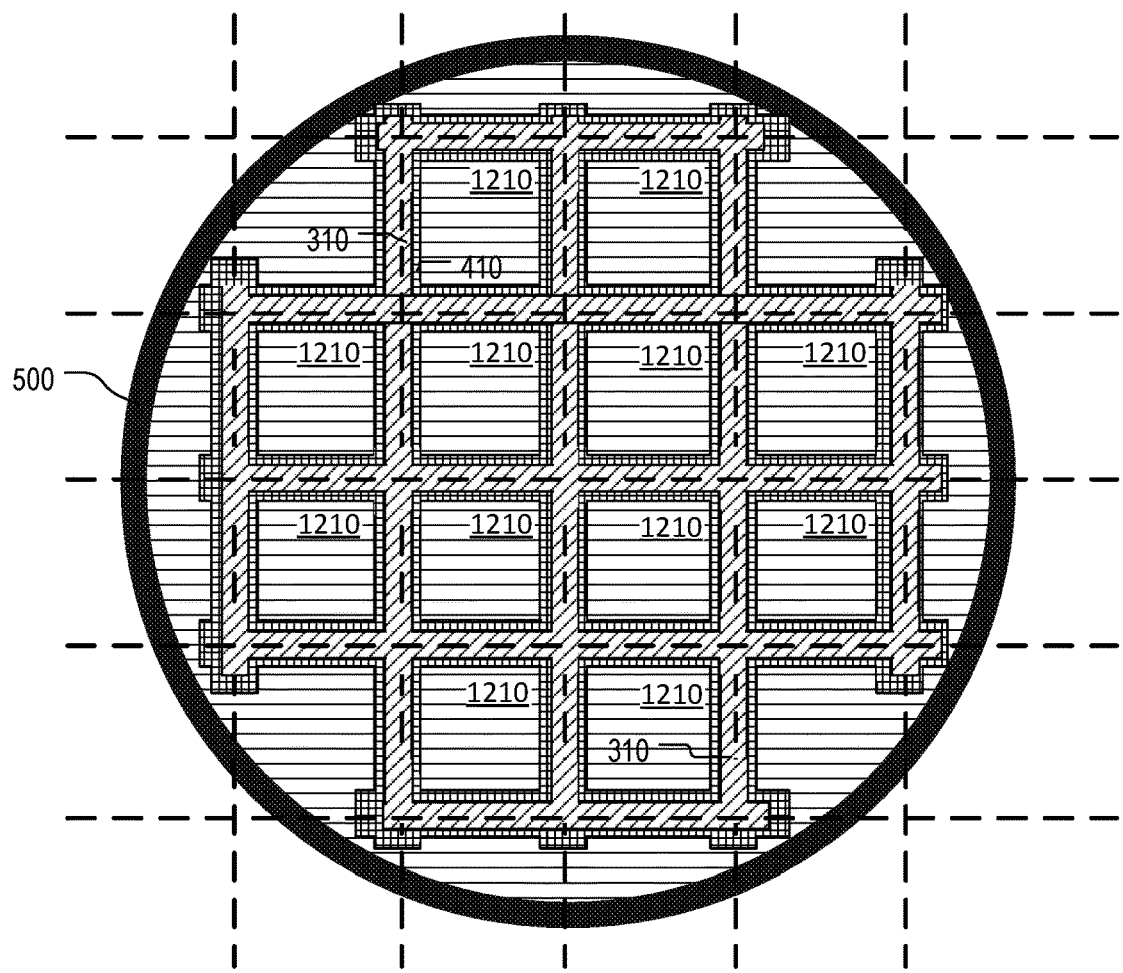
FIG. 12A is a top-down view of the wafer of FIG. 5A during a tenth stage of the process of FIGS. 2A-B, according to aspects of the disclosure.
Figure 12B:
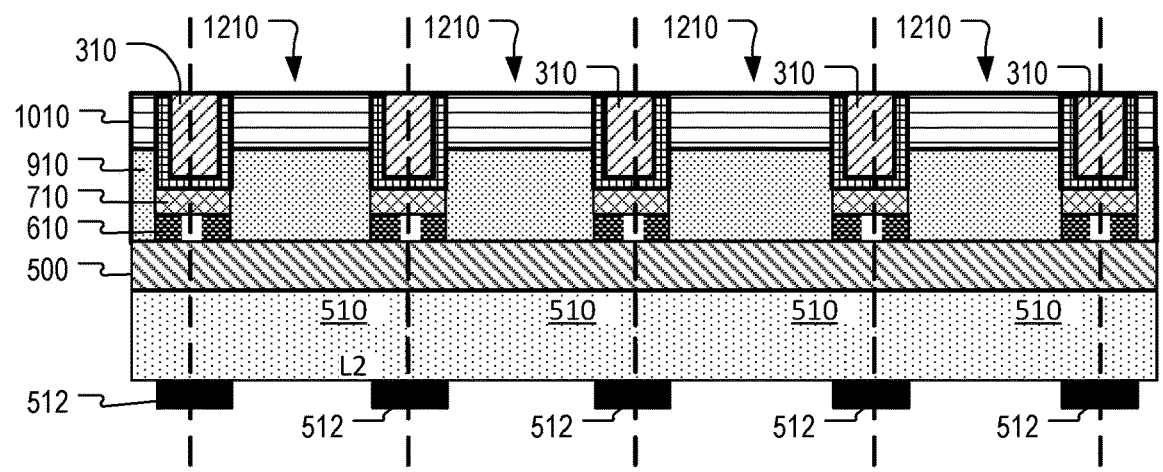
FIG. 12B is a cross-sectional side view of the wafer of FIG. 5A during a tenth stage of the process of FIGS. 2A-B, according to aspects of the disclosure.
Figure 12C:
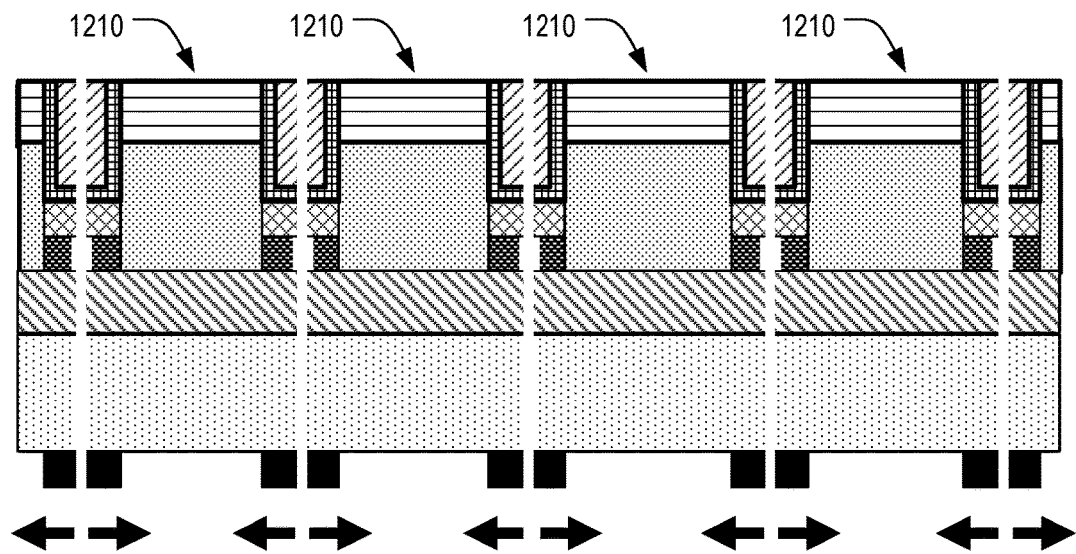
FIG. 12C is another cross-sectional side view of the wafer of FIG. 5A during the tenth stage of the process of FIGS. 2A-B, according to aspects of the disclosure.

At step 250, the assembly formed by executing steps 204-245 is cut to produce a plurality of LED packages 1210. Cutting the assembly may include longitudinally cutting through the walls 310 of the fence structure 300, as indicated by the dashed lines in FIG. 12A. Additionally or alternatively, cutting the assembly may include cutting through the portions of the wafer 500 that are coupled to the walls 310 (e.g., the portions of the wafer 500 that are situated directly underneath the wall 310), as indicated by the dashed lines in FIG. 12B. The wafer 500 and the walls 310 of the fence structure may be cut concurrently with one another. After the wafer 500 and the fence structure 300 are cut, the LED packages 1210 may be separated from each other, as shown in FIG. 12C. The separation may be performed using stretch-tape and/or any other suitable technique.

To clarify the cutting of the fence structure 300, it is worth noting that each wall 310 of the fence structure 300 includes a plurality of sections, wherein each section separates two neighboring cells 320. When the walls 310 are longitudinally cut, each such section may be split into two fractions (e.g., halves), such that one fraction remains on one LED package 1210 while the other fraction may remain in another LED package 1210. Each fraction may essentially become part of a different fence in a different LED package 1210. These fences may be individual confinement structures that are separated from the fence structure 300 when the fence structure 300 is cut and they may be used to contain the light-converting structures 912 and/or the light-diffusing structures 1012.

In some implementations, the walls 310 of the fence structure 300 and the wafer 500 may be cut concurrently and/or simultaneously. For example, the fence structure and the wafer 500 may be cut using a laser. In such instances, laser incisions may be performed along the light-transmissive portions 616 of the reflective lines 612, which may permit the laser light to travel across the reflective pattern 610 and dissipate in either the walls 310 or the wafer 500.

Additionally or alternatively, in some implementations, the walls of the fence structure 300 and the wafer 500 may be cut using another process. For example, in some implementations, the fence structure 300 and the wafer 500 may be stealth-diced at different depths. As another example, a saw may be used to cut through the fence structure 300 and expose the surface 504 of the wafer 500, after which laser singulation may be used to form smooth cuts through the wafer 500. As another example, a saw may be used to cut through the fence structure 300 and expose the surface 504 of the wafer 500, after which a laser may be used to cut the wafer 500. In this regard, the present disclosure is not limited to any specific technique for cutting the wafer 500 and the fence structure 300 to form the plurality of LED packages 1210.

Figure 13:
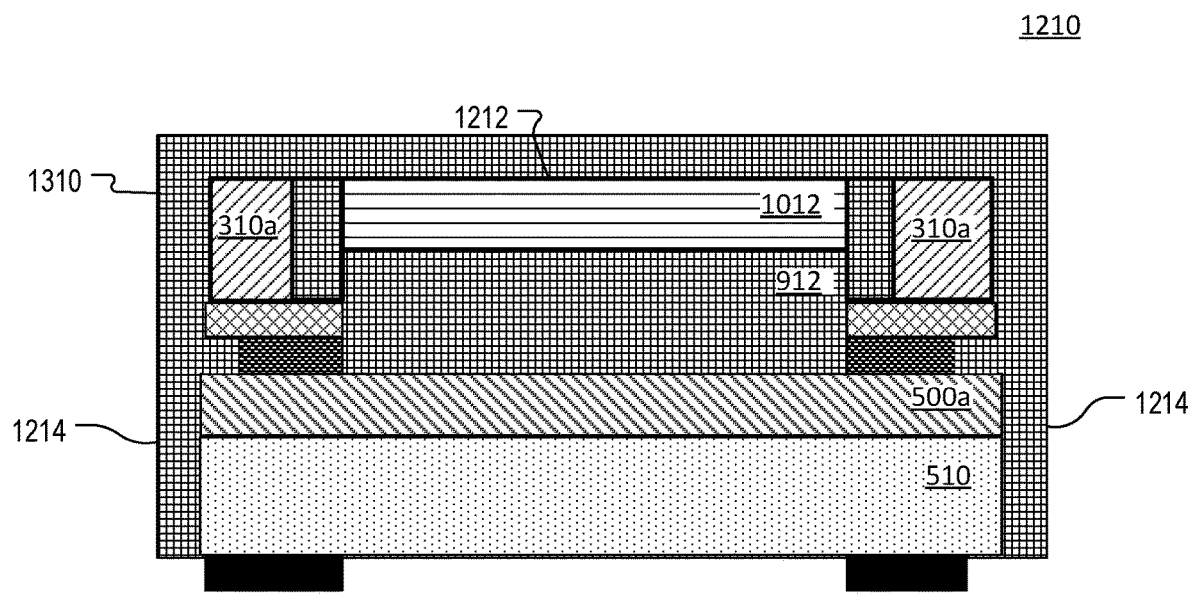
FIG. 13 is a cross-sectional side view of an LED package during an eleventh stage of the process of FIGS. 2A-B, according to aspects of the disclosure.

At step 255, a reflective element 1310 is formed on each of the resulting LED packages 1210. As illustrated in FIG. 13, the reflective element 1310 may be a reflective film that is formed by coating the top surface 1212 (e.g., light-emitting surface), and the outer side surfaces 1214 of the LED package 1210 with a dielectric material, such as $SiO_2$, $TiO_2$, $Si_3N_4$. In some implementations, the reflective element 1310 may be a Distributed Bragg Reflector (DBR). More particularly, the reflective element 1310 may include an alternating stack of $SiO_2$ and $TiO_2$ layers that are formed over one another. As can be readily appreciated, the reflective element 1310 may be formed of a dielectric material to avoid shorting the LED 510 in each of the LED packages 1210. However, alternative implementations are possible in which the reflective element is formed of a metal such as aluminum or silver, provided that an insulating coating is applied beforehand on the sides of each LED 510.

Figure 14A:
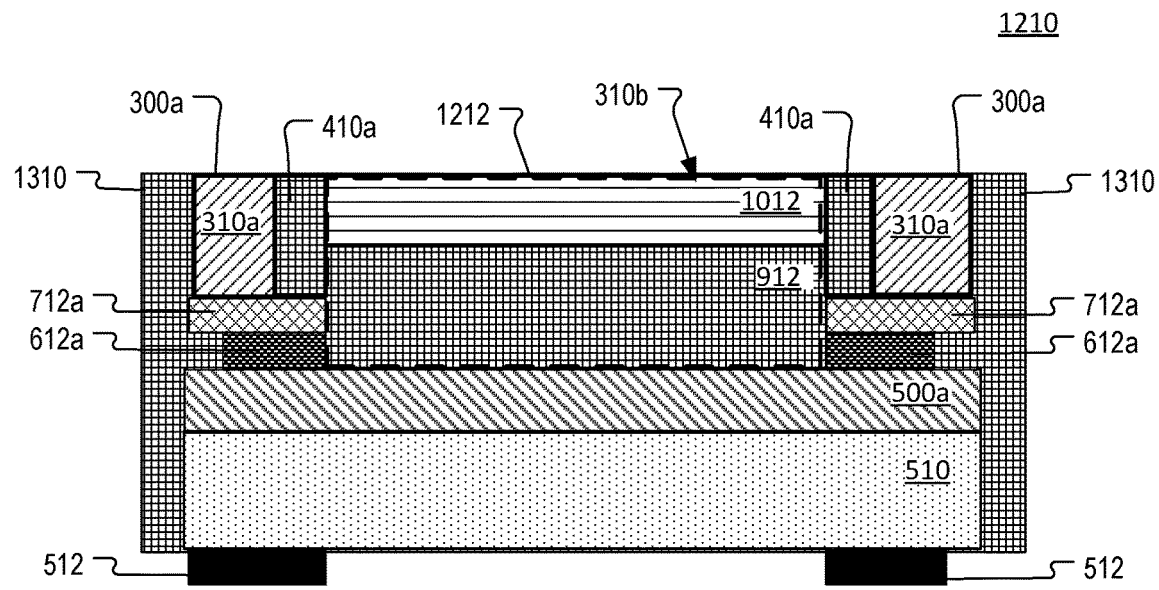
FIG. 14A is a cross-sectional side view of an LED package formed as a result of performing the process of FIGS. 2A-B, according to aspects of the disclosure.

At step 260, the top portion of the reflective element 1310 is removed, as shown in FIG. 14A, to expose the light-emitting surface 1212 of the LED package 1210. The top portion of the reflective element 1310 may be removed using any suitable process, such as back grinding, polishing, fly cutting, or abrasion blasting, for example.

The process 200 is provided as an example, only. One or more of the steps in the process 200 may be omitted. For example, in some implementations, step 220 may be omitted from the process 200. In such instances, no reflective pattern will be formed on the wafer 500. Additionally or alternatively, in some implementations, step 225 may be omitted from the process 200. In such instances, no bonding pattern will be formed on the wafer 500. Additionally or alternatively, in some implementations, step 240 may be omitted from the process 200. In such instances, no light-diffusing structures will be formed above the light-converting structures 912. Although in the present example, the fence structure 300 is a rectangular grid, alternative implementations are possible in which at least some of the walls 310 of the fence structure are curved. In such instances, at least some of the lines 612 of the reflective pattern 610 may also have substantially the same curvature as the walls 310 in order for the reflective pattern 610 to match the footprint of the fence structure 300. Furthermore, in such instances, at least some of the lines 712 of the bonding pattern 710 may also have substantially the same curvature as the walls 310 in order for the bonding pattern 710 to match the footprint of the fence structure 300.

Figure 2A:
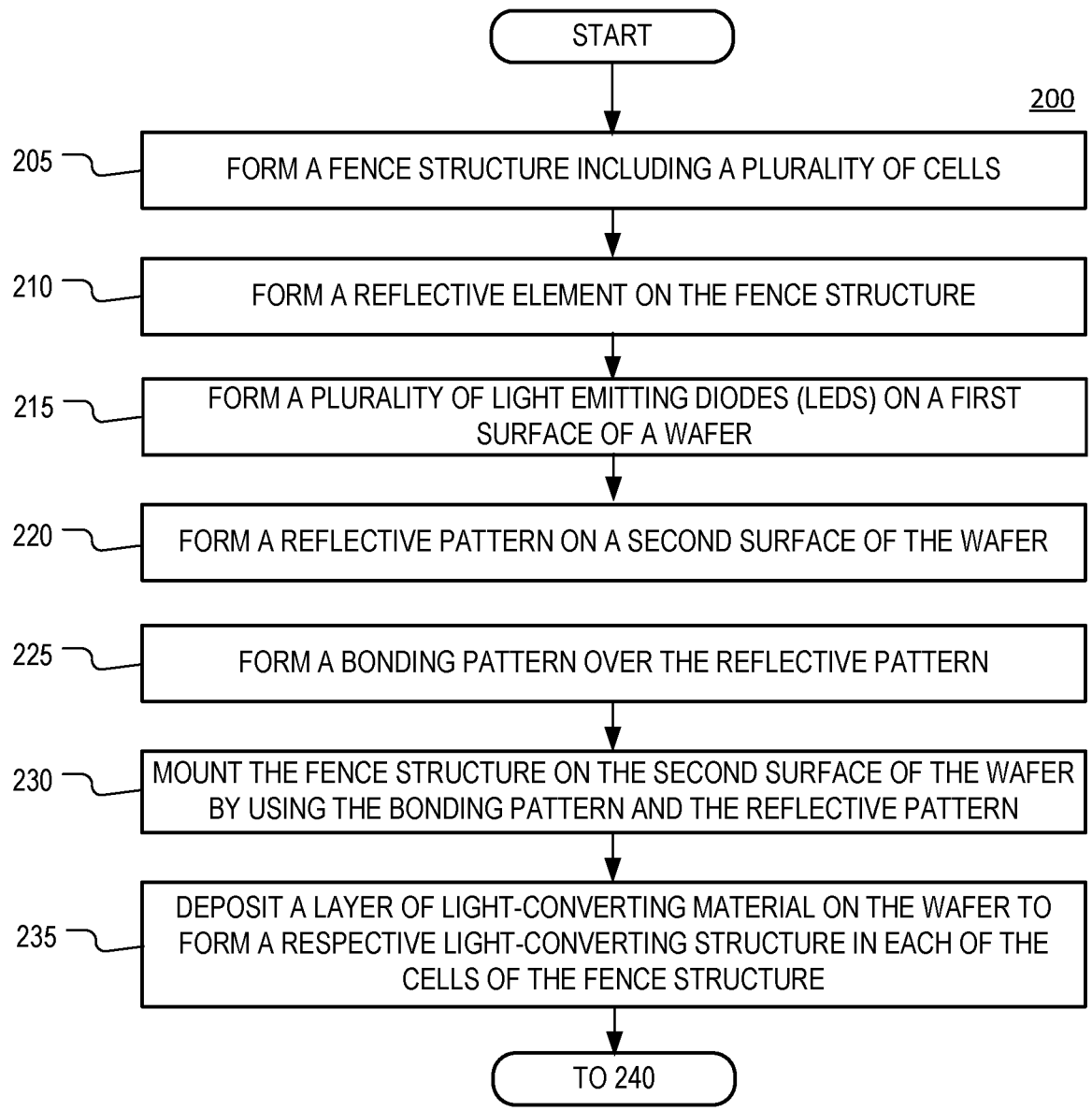
FIG. 2A is a flowchart illustrating a portion of a process for manufacturing LED packages, according to aspects of the disclosure.
Figure 2B:
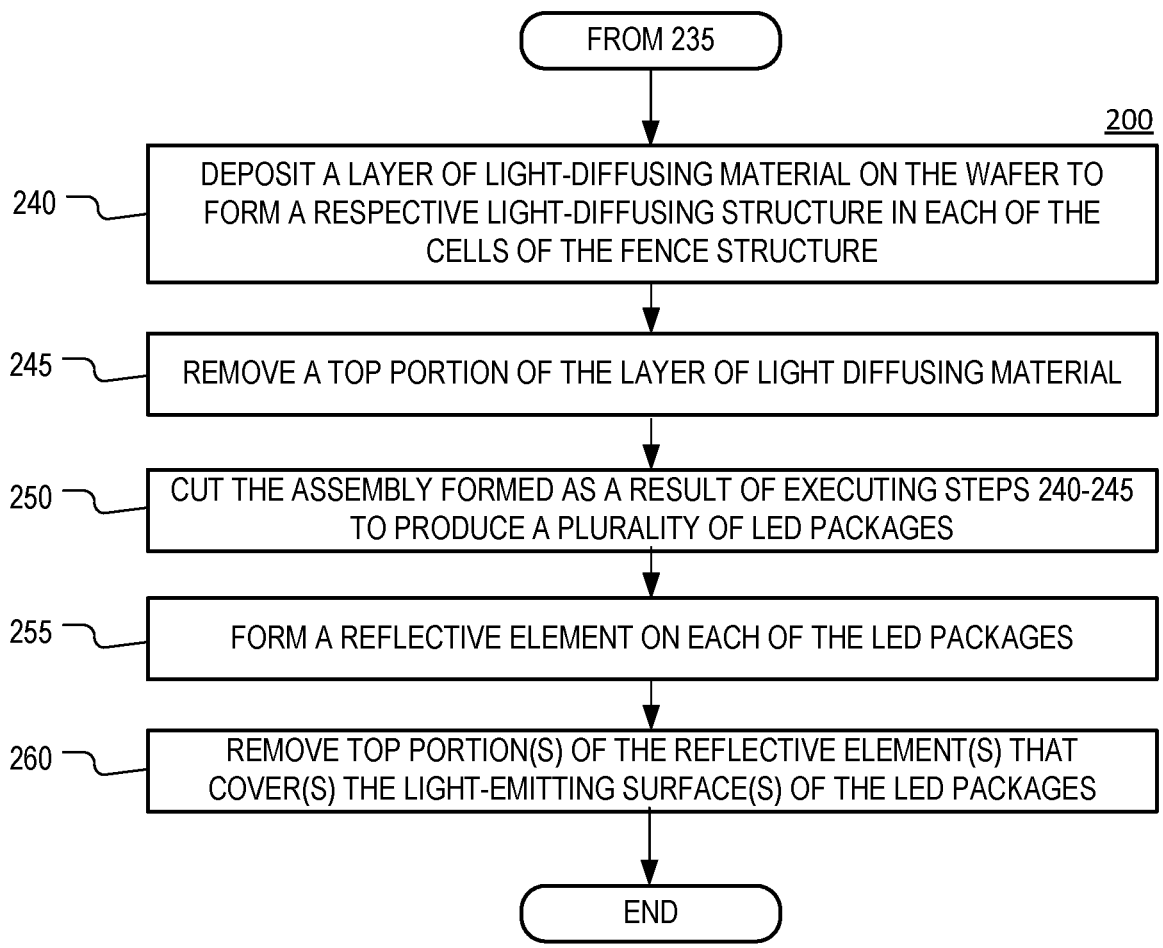
FIG. 2B is a flowchart illustrating another portion of the process for manufacturing LED packages, according to aspects of the disclosure.
Figure 14B:
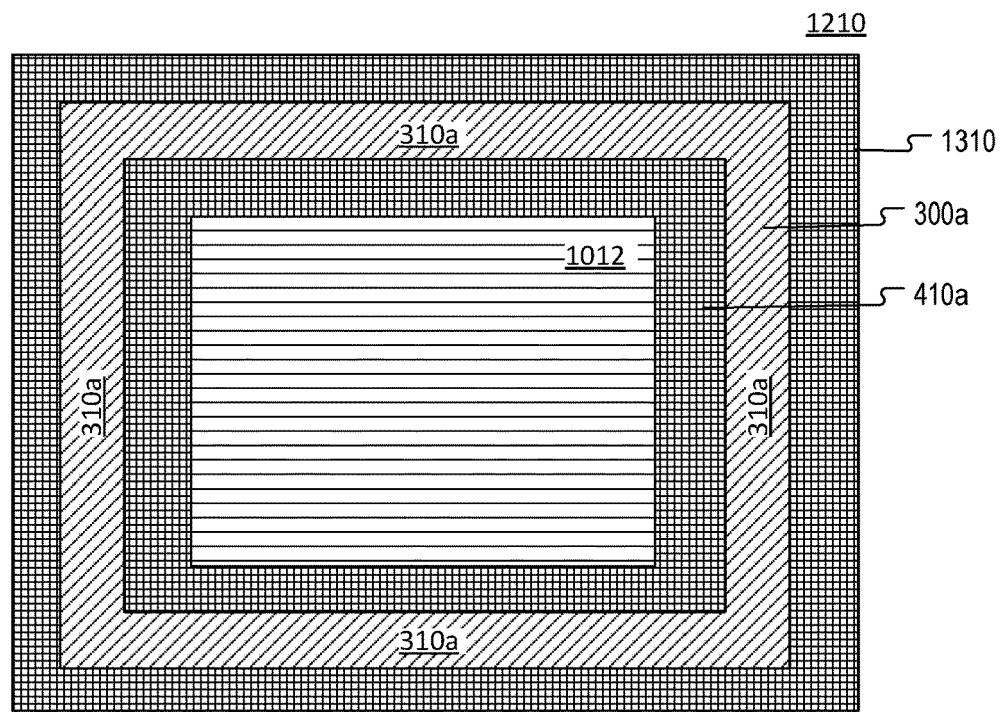
FIG. 14B is a top-down view of the LED package of FIG. 14A, according to aspects of the disclosure.

FIGS. 14A-B depict an example an LED package 1210 that is produced by performing the process 200 of FIGS. 2A-B. The LED package 1210 includes a substrate 500a. The substrate 500a is essentially a portion of the wafer 500 that is separated when the wafer 500 is cut. Disposed on a first surface of the substrate is an LED 510 that is arranged to emit primary light. Formed on a second surface of the substrate is a fence 300a. The fence 300a is a portion of the fence structure 300 that is separated when the fence structure 300 is cut. As illustrated, the fence 300a includes a plurality of walls 310a that define a cell 310b (denoted by the dashed rectangle). The cell 310b is aligned with the LED 510. In this regard, the cell which is wholly contained within the second surface of the substrate 500a and no portion of it extends over the edges of the LED 510. Disposed inside the cell is a light-converting structure 912 that is configured to convert primary light emitted from the LED 510 into secondary light having a different wavelength than the primary light. Disposed in the cell above the light-converting structure 912 is a light-diffusing structure 1012 that is configured to diffuse the secondary light. Furthermore, as illustrated, a reflective element 410a may be disposed on the interior surfaces of the walls 310a. The reflective element 410a may be a portion of the reflective element 410 that is separated when the fence structure 300 is cut.

Each of the lines 612a is a portion of a given line 612 that is separated when the wafer 500 is cut. In this regard, the lines 612 define a pattern that at least partially matches the footprint of the fence 300a. This pattern is essentially a portion of the reflective pattern 610 that is separated when the wafer 500 is cut. The footprint of the fence 300a may have the same or similar profile as the top surface of the fence 300a, which is shown in FIG. 14b. Each of the lines 612 may be disposed at least partially underneath a different wall 310 of the fence 300a, as shown.

Each of the lines 712a is a portion of a given line 712 that is separated when the wafer 500 is cut. In this regard, the lines 712 define a pattern that at least partially matches the footprint of the fence 300a. This pattern is essentially a portion of the bonding pattern 710 that is separated when the wafer 500 is cut. Each of the lines 712 may be disposed at least partially underneath a different wall 310 of the fence 300a, as shown.

Figure 15:
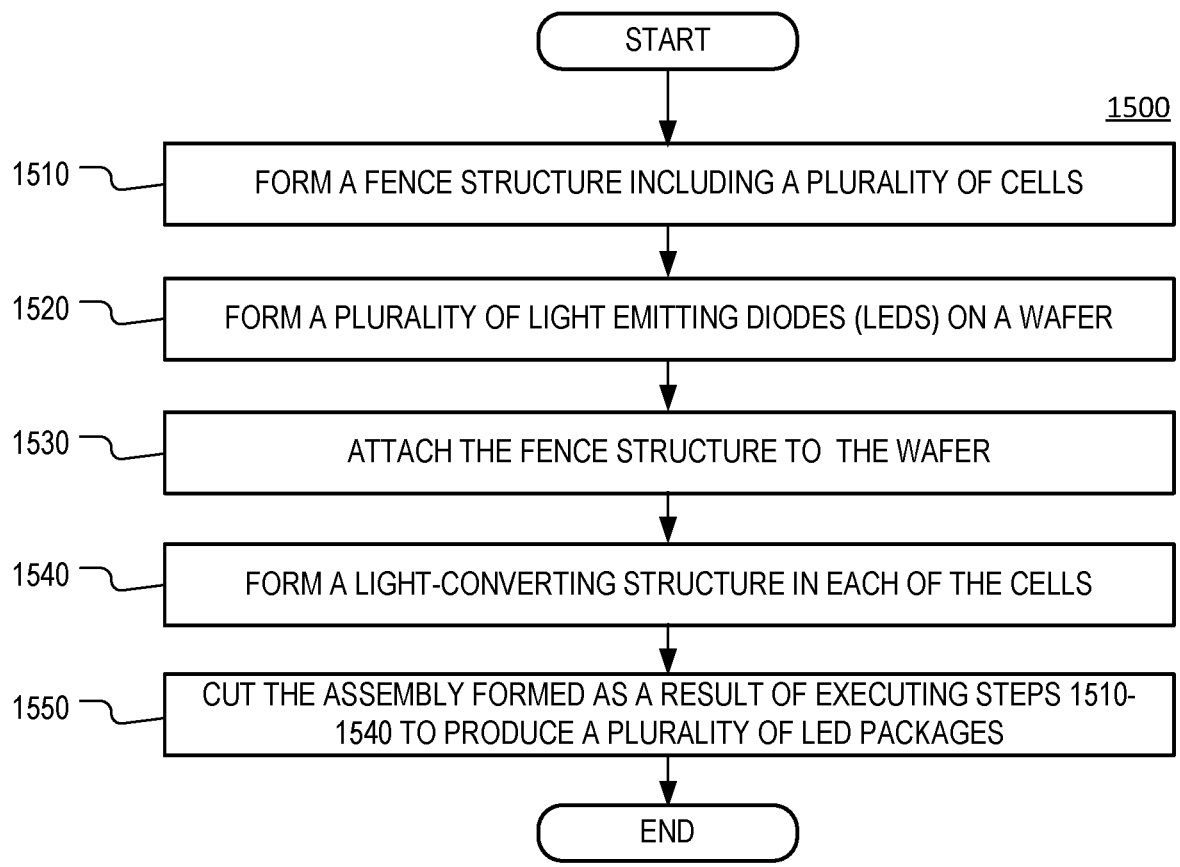
FIG. 15 is a flowchart of another process for manufacturing LED packages, according to aspects of the disclosure.

FIG. 15 is a flowchart of an example of a process 1500 for manufacturing light emitting diodes (LEDs), according to aspects of the disclosure. At step 1510, a fence structure is formed. The fence structure may be the same or similar to the fence structure 300, and it may include a plurality of walls that are arranged to define a set of cells. At step 1520, a plurality of LEDs is formed on a first surface of a wafer. In some implementations, the LEDs may be the same or similar to the LEDs 510, and the wafer may be similar to the wafer 500. Furthermore, in some implementations the order of steps 1510 and 1520 can be reversed or they may be performed concurrently. At step 1530, the fence structure is bonded to a second surface of the wafer that is opposite to the first surface. As a result of the bonding, each of the cells in the fence structure may be aligned with a different one of the LEDs on the first surface of the wafer. In some implementations, step 1530 may be performed in the same or similar manner similar to step 230 of the process 200. At step 1540, light-converting material is applied in each of the cells of the fence structure to form a light-converting structure. In some implementations, step 1540 may be performed in the same or similar manner as step 235 of the process 200. At step 1550, the assembly formed as a result of executing steps 1510-1540 is cut to produce a plurality of LED packages. Step 1550 may be the same or similar to step 250. After the wafer is cut and the LED packages are separated, a reflective film may be optionally formed on the sides of each package to produce a finished product that is the same or similar to the light-emitting device 100, shown in FIGS. 1A-B.

FIGS. 1-15 are provided as an example only. At least some of the steps discussed with respect to these figures can be arranged in different order, combined, and/or altogether omitted. In this regard, it will be understood that the provision of the examples described herein, as well as clauses phrased as "such as," "e.g.", "including", "in some aspects," "in some implementations," and the like should not be interpreted as limiting the disclosed subject matter to the specific examples.

Having described the invention in detail, those skilled in the art will appreciate that, given the present disclosure, modifications may be made to the invention without departing from the spirit of the inventive concepts described herein. Therefore, it is not intended that the scope of the invention be limited to the specific embodiments illustrated and described.

What is being claimed is:

1. A light-emitting device, comprising:
 a light-emitting diode (LED) on a first surface of a crystalline growth substrate;
 a fence structure having a bottom mounted to a limited portion of a second surface of the crystalline growth substrate that is opposite the first surface of the crystalline growth substrate, the fence structure including a plurality of walls, between which a hole passes from a top of the fence structure to the bottom of the fence structure to define a cell;
 a light-converting structure on the second surface of the crystalline growth substrate in the cell; and
 a reflective layer directly contacting an outer surface of the plurality of walls of the fence structure; and
 a reflective pattern formed on the second surface of the crystalline growth substrate, the reflective pattern including a plurality of lines, each line being at least partially coincident with a different wall of the fence structure and formed between the wall of the fence structure and the substrate, the each line comprising a distributed Bragg reflector (DBR) comprising an alternating stack of materials having differing refractive indices.

2. The light-emitting device of claim 1, wherein at least one of:
 the fence structure comprises at least one of a glass material, a metal material, a polymer material, and a ceramic material, and
 the reflective layer comprises a film of inorganic reflective material.

3. The light-emitting device of claim 1, wherein each of the plurality of walls of the fence structure is adjacent to a different edge of the crystalline growth substrate.

4. The light-emitting device of claim 1, wherein the fence structure is mounted to the second surface of the crystalline growth substrate via a bonding pattern that at least partially matches a footprint of the fence.

5. The light-emitting device of claim 1, further comprising a light-diffusing structure disposed in the cell, the light-diffusing structure configured to diffuse light that is emitted from the light-converting structure.

6. The light-emitting device of claim 1, further comprising a reflective element that contacts each wall of the fence structure and the light-converting structure.

7. The light-emitting device of claim 1, wherein the reflective layer is additionally on sidewalls of the crystalline growth substrate and sidewalls of the LED such that the reflective layer and the light-converting structure are disposed on opposite sides of the walls of the fence, the reflective layer on the sidewalls of the crystalline growth substrate, the sidewalls of the LED, and the outer surface of the plurality of walls of the fence structure being a single contiguous layer.

8. The light-emitting device of claim 1, further comprising a bonding pattern disposed adjacent to the light-converting structure and between the fence structure and the reflective pattern, the bonding pattern configured to bond the fence structure and the reflective pattern together, the bonding pattern disposed under only a portion of each wall of the fence structure.

9. The light-emitting device of claim 8, further comprising a reflective element disposed between each wall of the fence structure and the light-converting structure, the bonding pattern further disposed between the reflective element and the reflective pattern to bond the reflective element and the reflective pattern together.

10. A light emitting device comprising:
a light-emitting diode (LED) on a first surface of a crystalline growth substrate;
reflective lines formed on a second surface of the crystalline growth substrate, each reflective line comprising a distributed Bragg reflector (DBR) comprising an alternating stack of materials having differing refractive indices;
a fence structure having a bottom mounted to the reflective lines by a bonding layer, the fence structure including a plurality of walls, between which a hole passes from a top of the fence structure to the bottom of the fence structure configured to define a cell, the each reflective line being at least partially coincident with a different wall of the fence structure and formed between the wall of the fence structure and the crystalline growth substrate;
a first reflective layer contacting an inner surface of the plurality of walls;
a light-converting structure on the second surface of the crystalline growth substrate in the cell; and
a second reflective layer directly contacting an outer surface of the plurality of walls.

11. The light-emitting device of claim 10, further comprising a light-diffusing structure disposed in the cell, the light-diffusing structure configured to diffuse light that is emitted from the light-converting structure.

12. The light-emitting device of claim 10, wherein the bonding layer has a width that is greater than a width of the reflective lines.

13. The light-emitting device of claim 10, wherein each of the plurality of walls of the fence structure is adjacent to a different edge of the substrate.

14. The light-emitting device of claim 10, wherein at least one of the first reflective layer and the second reflective layer comprises a film of inorganic reflective material.

15. The light-emitting device of claim 10, wherein the bonding layer is formed as a bonding pattern disposed under the first reflective layer and only under a portion of each wall of the fence structure.

16. The light-emitting device of claim 10, wherein the light-converting structure contacts the first reflective layer, the bonding layer, and the reflective lines.

17. The light-emitting device of claim 10, wherein the second reflective layer is additionally on sidewalls of the crystalline growth substrate and sidewalls of the LED such that the second reflective layer and the light-converting structure are disposed on opposite sides of the walls of the fence, the second reflective layer on the sidewalls of the crystalline growth substrate, the sidewalls of the LED, and the outer surface of the plurality of walls of the fence structure being a single contiguous layer.

18. A method of forming a light-emitting device, the method comprising:
forming a light-emitting diode (LED) on a first surface of a crystalline growth substrate;
mounting a bottom of a fence structure to a limited portion of a second surface of the crystalline growth substrate that is opposite the first surface of the crystalline growth substrate, the fence structure including a plurality of walls, between which a hole passes from a top of the fence structure to the bottom of the fence structure to define a cell;
forming a light-converting structure on the second surface of the crystalline growth substrate in the cell;
forming a reflective layer on an outer surface of the plurality of walls of the fence structure to directly contact the outer surface of the plurality of walls of the fence structure, sidewalls of the crystalline growth substrate, and sidewalls of the LED; and
forming a reflective pattern on the second surface of the crystalline growth substrate, the reflective pattern including a plurality of lines, each line being at least partially coincident with a different wall of the fence structure and formed between the wall of the fence structure and the substrate, the each line comprising a distributed Bragg reflector (DBR) comprising an alternating stack of materials having differing refractive indices.

19. The method of claim 18, further comprising:
forming the reflective layer on sidewalls of the crystalline growth substrate and sidewalls of the LED, such that the reflective layer and the light-converting structure are disposed on opposite sides of the walls of the fence.

* * * * *